United States Patent [19]
Kariya et al.

[11] Patent Number: 5,164,974
[45] Date of Patent: Nov. 17, 1992

[54] X-RAY EXPOSURE APPARATUS

[75] Inventors: Takao Kariya, Akigawa; Yasuo Kawai, Tagata; Masahiko Okunuki, Tokyo; Susumu Gotoh, Hachiohji, all of Japan

[73] Assignee: Canon Kabushiki Kaisha, Tokyo, Japan

[21] Appl. No.: 714,353

[22] Filed: Jun. 12, 1991

Related U.S. Application Data

[63] Continuation of Ser. No. 637,942, Jan. 8, 1991, abandoned, which is a continuation of Ser. No. 14,181, Feb. 11, 1987, abandoned, which is a continuation of Ser. No. 630,186, Jul. 12, 1984, abandoned.

[30] Foreign Application Priority Data

Feb. 24, 1984 [JP]  Japan .................. 59-33611
Mar. 28, 1984 [JP]  Japan .................. 59-61335

[51] Int. Cl.$^5$ .............................................. G21K 5/00
[52] U.S. Cl. ............................... 378/34; 378/205; 250/491.1
[58] Field of Search ........... 378/34, 35, 205, 208, 378/147–149; 250/491.1, 454.1; 430/5, 311, 966, 967

[56] References Cited

U.S. PATENT DOCUMENTS

| | | | |
|---|---|---|---|
| 3,887,811 | 6/1975 | Livesay | 250/491.1 |
| 3,947,687 | 3/1976 | Fenstermacher | 378/34 |
| 3,982,133 | 9/1976 | Jupa et al. | 378/148 |
| 4,096,389 | 6/1978 | Ashe et al. | 250/445 |
| 4,181,839 | 1/1980 | Hatton et al. | 378/148 |
| 4,184,078 | 1/1980 | Nagel et al. | 250/492 |
| 4,185,202 | 1/1980 | Dean et al. | 378/34 |
| 4,238,685 | 12/1980 | Tischer | 378/34 |
| 4,242,588 | 12/1980 | Silk et al. | 378/34 |
| 4,284,887 | 8/1981 | Kusumoto et al. | 378/82 |
| 4,295,072 | 10/1981 | Todokoro et al. | 250/441.1 |
| 4,301,237 | 11/1981 | Burns | 378/35 |
| 4,370,554 | 1/1983 | Bohlen et al. | 250/491.1 |
| 4,419,585 | 12/1983 | Strauss et al. | 378/149 |
| 4,419,763 | 12/1983 | Hawman | 378/149 |
| 4,467,210 | 8/1984 | Sugihara et al. | 250/441.1 |
| 4,475,223 | 10/1984 | Taniguchi et al. | 378/34 |
| 4,514,857 | 4/1985 | Kimura et al. | 378/34 |
| 4,516,253 | 5/1985 | Novak | 378/34 |
| 4,525,852 | 6/1985 | Rosenberg | 378/34 |
| 4,539,695 | 9/1985 | La Fiandra | 378/34 |
| 4,613,981 | 9/1986 | Siddall et al. | 378/34 |
| 4,979,195 | 12/1990 | Tabata et al. | 378/34 |
| 5,073,918 | 12/1991 | Kamon | 378/34 |

FOREIGN PATENT DOCUMENTS

| | | |
|---|---|---|
| 0065143 | 11/1982 | European Pat. Off. . |
| 0083394 | 7/1983 | European Pat. Off. . |
| 0083408 | 7/1983 | European Pat. Off. . |
| 2519156 | 7/1983 | France . |
| 0102184 | 8/1979 | Japan .................. 250/363 S H |
| 56-111218 | 9/1981 | Japan . |
| 0000340 | 6/1979 | PCT Int'l Appl. . |
| 2012452 | 7/1979 | United Kingdom . |
| 2142158 | 1/1985 | United Kingdom . |
| 2155201 | 9/1985 | United Kingdom .................. 378/34 |

OTHER PUBLICATIONS

Solid State Technology, Aug. 1981, pp. 57–59.
J. Vac. Sci. Technology, Nov./Dec. 1981, pp. 1194–1199.
Maydan, IEEE Trans. Elect. Ddv., vol. 22, No. 7 (1975) 429:33.

*Primary Examiner*—David P. Porta
*Attorney, Agent, or Firm*—Fitzpatrick, Cella, Harper & Scinto

[57] ABSTRACT

An X-ray exposure apparatus wherein a member sensitive to X-ray is exposed to a pattern formed on a mask with the X-rays, includes an X-ray source for emitting X-rays, an irradiation chamber for accommodating the mask and the sensitive member and exposing them to the X-rays emitted by the X-ray source within the chamber and a vacuum pump for evacuating the chamber to effect the exposure operation in a vacuum.

19 Claims, 19 Drawing Sheets

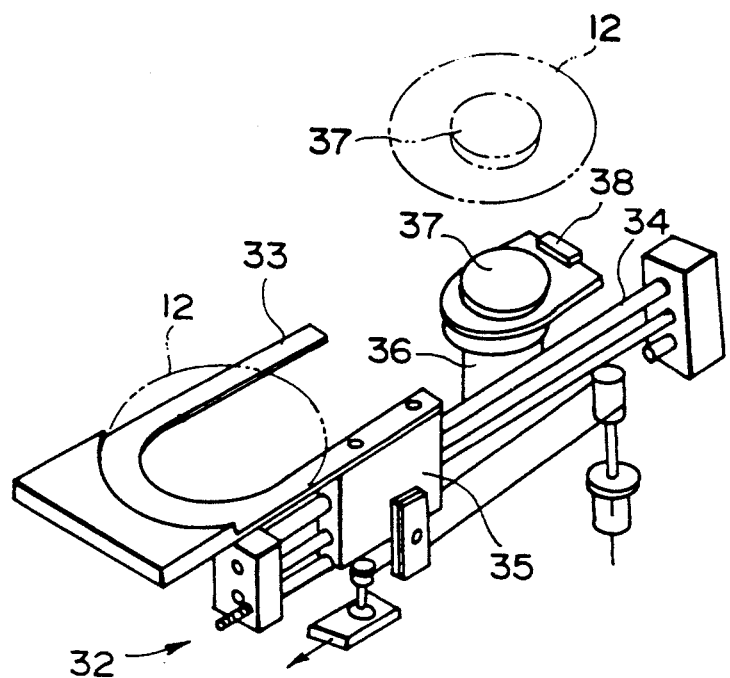
F I G. 7
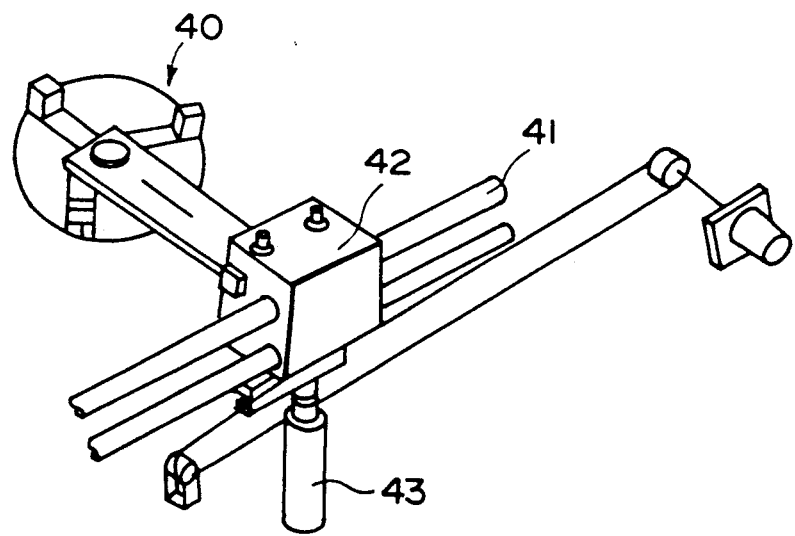
F I G. 8

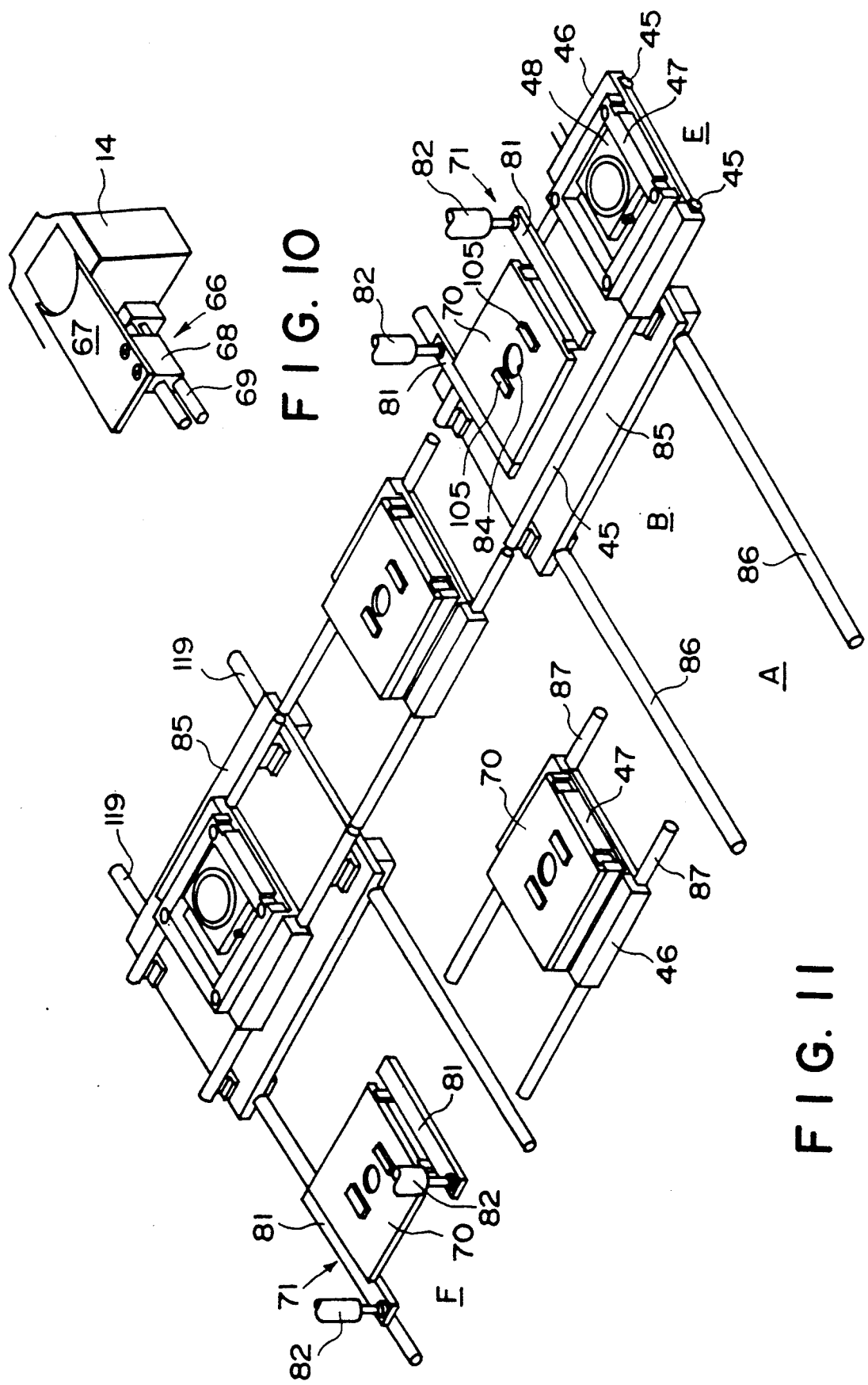

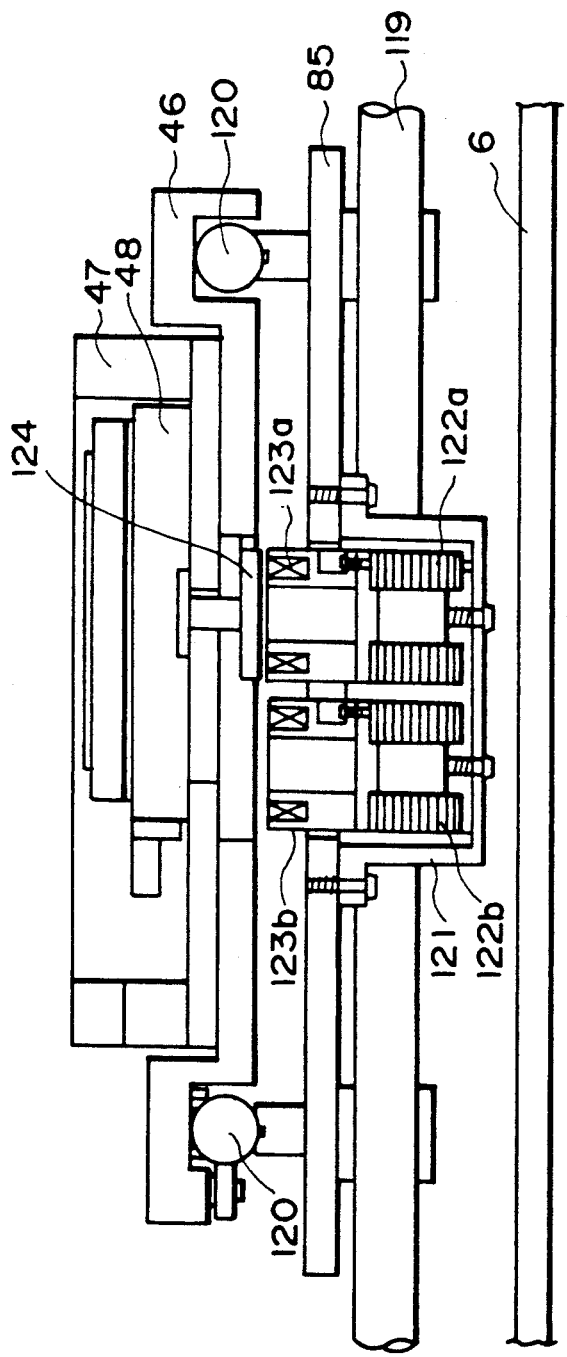
F I G. 21

X-RAY EXPOSURE APPARATUS

This application is a continuation of application Ser. No. 07/637,942 filed Jan. 8, 1991; which is a continuation of application Ser. No. 014,181 filed Feb. 11, 1987, which is a continuation of application Ser. No. 630,186 filed Jul. 12, 1984, all now abandoned.

BACKGROUND OF THE INVENTION

The present invention relates to an x-ray exposure apparatus usable with a lithography process, for manufacturing highly integrated semiconductor devices more particularly, in a pattern exposure step of such a process.

Because of the demand for the increasing degree of integration of circuits, the width of a line constituting a circuit pattern is now required to be on the order of a micron and further, even sub-micron. To meet this demand, radiation energy having a shorter wavelength is used for printing the circuit pattern, such as ultraviolet radiation, far-ultraviolet radiation and soft X-ray radiation.

As to a lithography apparatus using the soft X-ray radiation, efforts have been made to develop a commercial machine for over ten years, but no success in achieving a practical semiconductor manufacturing device using soft X-ray radiation has been reported as yet. The reasons would be in the difficulties in achieving proper and balanced resolution power, alignment accuracy, throughput, reliability, operability, cost and others.

However, considering in further detail those points, one of the most important problems is with the fact that it is even more difficult to handle the soft X-ray radiation as compared with the ultraviolet radiation. As is well known, the soft X-rays have to be emitted within an evacuated container. Therefore, in order to irradiate with soft X-rays a mask and a wafer which are superposed either in contact with each other or without contact, the soft X-rays are introduced thereto through a window of the vacuum container which is sealed by beryllium foil. The beryllium foil is employed because it absorbs a very small percentage of the soft X-rays. However, it has to be durable against the pressure difference between the high vacuum within the container and the atmospheric pressure under which the mask and the wafer are present, so that approximately 50 microns thickness of the foil is required. The beryllium foil of this thickness absorbs as large as 50% of the soft X-rays, which is disadvantageous.

Another problem stems from divergence of the soft X-rays. When the soft X-rays irradiate the mask and the wafer registered therewith without contact, an image of the mask pattern formed on the wafer may have different dimensions from the original pattern on the mask, if the wafer is inclined with respect to the mask. To avoid this, it is needed to maintain them parallel, but it is extremely difficult to mechanically achieve this. In addition, the divergent rays necessarily result in different projection dimensions between the central area and the marginal area. This requires that the center of the mask be aligned with the axis of the X-ray source for each of the pattern exposure operations, in addition to the alignment between the mask and the wafer.

A further problem is caused by the fact that, when a wafer which has been exposed to a pattern is chemically processed by etching or the like, the wafer is expanded or reduced. This is particularly important when large diameter wafers are used, which is a recent trend or demand, such as 6 inch or 8 inch diameter wafer, since then the expansion or reduction of the wafer can not be neglected. It is, therefore, important to minimize the possible influence of the wafer expansion or reduction in the pattern image.

SUMMARY OF THE INVENTION

In addition to those problems, the inventors have noted particularly a problem which is peculiar to soft X-rays. FIG. 24 shows a relation between X-ray energy and the strength of the X-rays when they are generated by accelerating electrons to high velocity and suddenly stopping them by collision with a target. The decreasing smooth line exhibits the continuous property, and the peaks exhibit the peculiar property, which is in dependence on the materials of the target.

The area in the graph of FIG. 24 which is lower than 4 KeV in the X-ray energy is used to expose the wafer, but the area which is to the left-hand side of the broken line is absorbed by the beryllium, so that the area which is actually used for the exposure energy is only the area defined by the broken line and the line of 4 KeV.

In brief, the introduction of the soft X-rays from the vacuum container entails a large loss of energy.

Accordingly, it is a principal object of the present invention to provide an X-ray exposure apparatus wherein the energy from the X-ray source is efficiently used for irradiating a mask and/or wafer.

It is another object of the present invention to provide an X-ray exposure apparatus wherein a divergent property component of the X-rays, which causes inconvenience upon exposure of the wafer to a pattern of the mask, can be eliminated.

It is a further object of the present invention to provide an X-ray exposure apparatus wherein an area of the wafer covered by one shot of the exposure is reduced to minimize the influence of the reduction and expansion of the wafer.

It has been found that there is an additional problem. When a substance is placed in a vacuum, the gases contained in the surface layer thereof are emitted and remarkably reduce the vacuum. And, the gases produced at the target employed in the X-ray source may adversely affect another part of the apparatus.

Accordingly, it is a further object of the present invention to provide an X-ray exposure apparatus which is substantially free from this problem.

The inventors have noted a further additional problem. When a wafer coated with a resist is placed in a vacuum, the gases contained in the surface layer of the wafer are gradually emitted and again remarkably reduce the vacuum in the X-ray exposure apparatus. When this occurs, a thermionic cathode which is used for generating an electron beam is significantly worn. As a result, the electron beam generation is disabled, so that the X-ray exposure apparatus is also disabled.

Furthermore, when the vacuum is reduced, a carbonaceous material is deposited on the parts which are at a high temperature, and an electric discharge can occur at the parts to which a high voltage is applied, so that those parts are disabled. Additionally, the parts of high precision are damaged by the deposition of the substance produced from the gases thereon.

Moreover, after the gases are repeatedly introduced by the wafers or wafer cassette, the gases themselves or a product from the gases is deposited and accumulated on the inside of the apparatus, even to such an extent that the apparatus can not be evacuated to a desired degree.

Therefore, it is a further object of the present invention to provide a wafer chamber which can eliminate those problems, and an X-ray exposure apparatus provided with such a chamber.

It is a yet further object of the present invention to provide mechanisms, systems, arrangements, devices, processes and methods for effectively handling, supporting, gripping, transferring and moving the wafer and/or the mask and other various elements.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 7 is a perspective view of a wafer feeding apparatus according to an embodiment of the present invention.

FIG. 8 is a perspective view of a wafer handling mechanism according to an embodiment of the present invention.

FIG. 10 is a perspective view of a wafer discharging mechanism according to an embodiment of the present invention.

FIG. 11 is a perspective view illustrating a wafer unloading mechanism according to an embodiment of the present invention.

FIG. 21 is a cross-sectional view illustrating an operation at an irradiation station of the devices according to an embodiment of the present invention.

DESCRIPTION OF THE PREFERRED EMBODIMENTS

Figure 1:
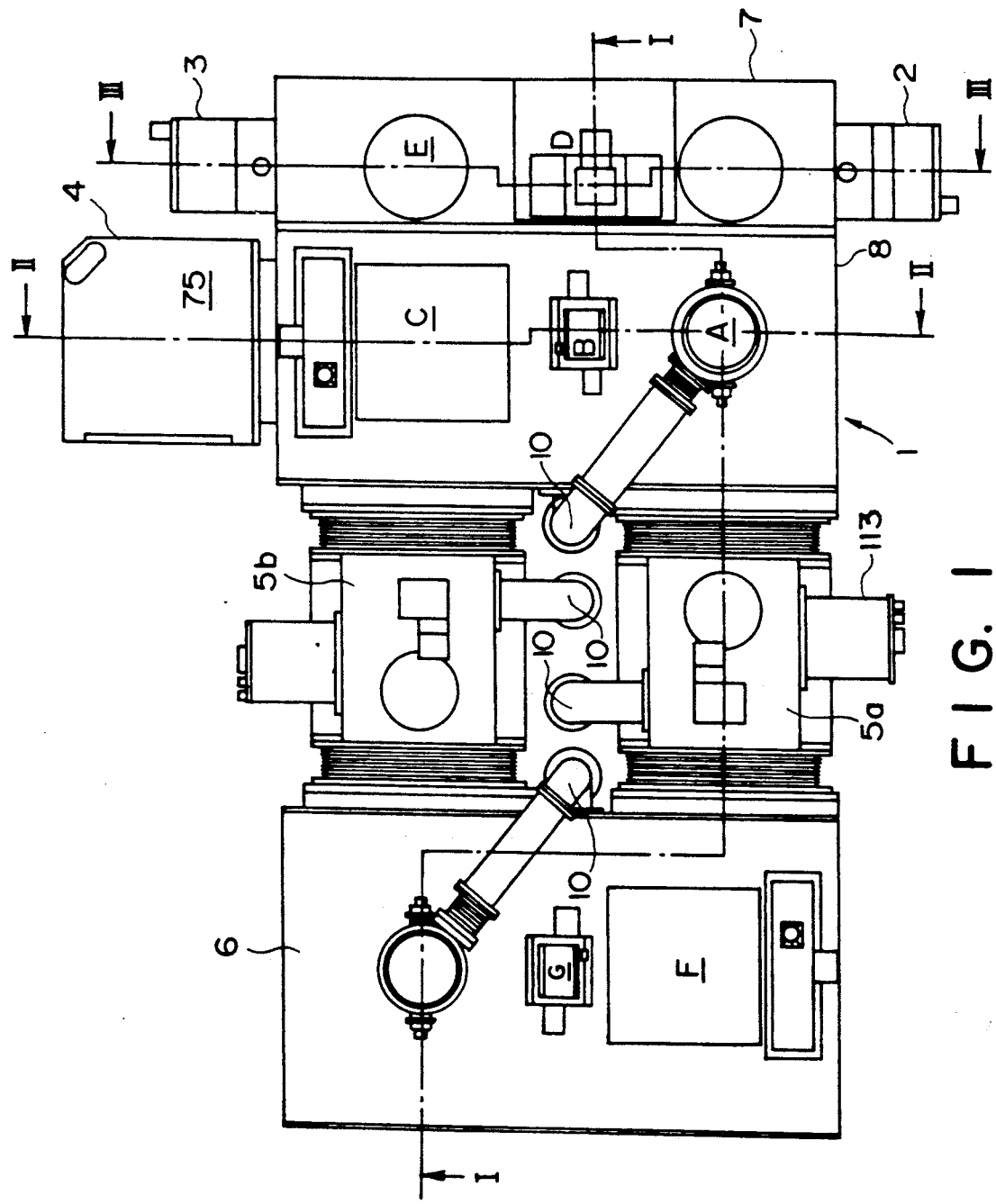
FIG. 1 is a plan view of an X-ray exposure apparatus according to an embodiment of the present invention.

The preferred embodiments of the present invention will now be described in conjunction with the accompanying drawings. Referring to FIG. 1, there is shown a general arrangement of an X-ray exposure apparatus according to an embodiment of the present invention, which comprises a main chamber 1, a wafer loading cassette accommodating chamber 2 and a wafer unloading cassette accommodating chamber 3 which are disposed at opposite sides of the main chamber 1, a mask cassette accommodating chamber 4 which is juxtaposed with the wafer unloading cassette accommodating chamber 3 at a side of the main chamber 1, irradiation chambers 5a and 5b and a sub-chamber 6.

The main chamber 1 includes a first portion 7 to which the accommodating chamber 2 and the accommodating chamber 3 are connected at the opposite sides thereof and a second portion 8 to which the mask cassette accommodating chamber 4 is connected at one side thereof. The connections between the first main chamber portion 7 and the wafer loading cassette accommodating chamber 2 and between the first main chamber portion 7 and the wafer unloading cassette accommodating chamber 3, and the connection between the second main chamber portion 8 and the mask cassette accommodating chamber 4, are such that they can each maintain a vacuum independently from the others.

Also, the connections between the irradiation chambers 5a and 5b and the main chamber 1 and between the irradiation chambers 5a and 5b and the sub-chamber 6 are such that they can each maintain the vacuum independently from the others. Between those chambers, isolating valves 9 are provided in order to isolate them, if necessary. For instance, when it is necessary to exchange or service an X-ray tube in the irradiation chamber 5a or 5b, the necessary operations are carried out after the associated isolating valve 9 is closed. Then the rest of the chambers, namely chambers 1 and 6, can maintain the vacuum. This is advantageous in that, before resuming the operation of the apparatus after the maintenance operation, it suffices for the resumption if only the irradiation chamber 5a or 5b is evacuated, so that the time required for evacuation can be reduced. The chambers 1, 2, 3, 4, 5a, 5b and 6 are provided at their proper sides with ports communicatable with a vacuum pump 140 (FIG. 2) and also provided with pipes 10 for proper communication among them.

Here, brief explanations will be made in conjunction with FIGS. 2, 3 and 4, as to major devices, mechanisms and operations therein. As shown in FIG. 4, the wafer loading cassette accommodating chamber 2 is provided with a device for receiving a cassette 13 containing plural wafers 12, each of which has been coated with a photoresist to be exposed to a circuit pattern by the X-ray exposure apparatus. This receiving device is capable of vertically moving the cassette 13 to contribute to feed plural wafers into the first main chamber portion 7, sequentially.

In the first main chamber portion 7, there is provided, adjacent to the chamber 2, a feeding device for feeding the wafers one at a time from the cassette 13 located in the chamber 2. In the middle of the length of the first main chamber portion 7, the parallel plane setting mechanisms for the wafers are disposed, whereat the position of the wafer is adjusted and fixed so that a surface of the wafer is parallel with a reference surface of the wafer holder supported on the irradiation table. At a position in the first main chamber portion 7 which is in the neighborhood of the wafer unloading cassette accommodating chamber 3, a discharging device is provided to discharge into the chamber 3 the wafer which has been subjected to the pattern exposure step on its entire surface.

In the chamber 3, similarly to the chamber 2, there is a device for receiving a cassette 14 containing the wafers. This receiving device is capable of moving the cassette 14 vertically and is effective to store one by one the wafers which have been subjected to the irradiation steps.

An explanation will be made, referring to FIG. 3, as to the major devices and operations relating to the mask accommodating chamber 4 and the second main chamber portion 8. The mask accommodating chamber 4 contains therein a mask cassette 15, which accommodates plural masks 16. Additionally, there is provided a device for rotating the mask cassette 15 to move a desired mask 16 of the plural masks in compliance with the irradiation steps.

The second main chamber portion 8 includes, adjacent to the mask chamber 4, a mask moving device which is used for taking the mask out of the cassette or for returning the mask to the cassette. At an upper portion of the second chamber portion 8, there is a vertically movable mask handler which holds the mask holder. A pre-alignment microscope 17 is provided at an upper portion in the middle of the length of the second chamber portion 8 to effect a coarse alignment between the mask and the wafer. At an upper portion of the second main chamber portion 8 in the neighborhood of the pre-alignment microscope 17, there is a fine alignment electron microscope 18 to perform the precise alignment between the mask and the wafer. Additionally, at an inside of the second chamber portion 8, a coarse and fine movement device which is movable over the length of the chamber portion 8, is provided to move the mask and the wafer during the pre-alignment and fine alignment operations.

The major devices, mechanisms and operations associated with the sub-chamber 6 are similar to those explained with respect to the second main chamber portion 8, with the exception that it is not equipped with the mask moving device operated when the mask is taken out of the cassette or when the mask is returned thereto.

As shown in FIG. 1, the irradiation chambers 5a and 5b each contain an X-ray tube. The mask and the wafer are irradiated by the X-rays while being passed through the chamber on a table. By this irradiation, the wafer is exposed to the pattern of the mask, or the pattern of the mask is transferred to printed on the wafer.

As an example, it is assumed that a wafer includes four separate irradiation areas, in order to explain the general operation of the X-ray exposure apparatus.

Figure 5:
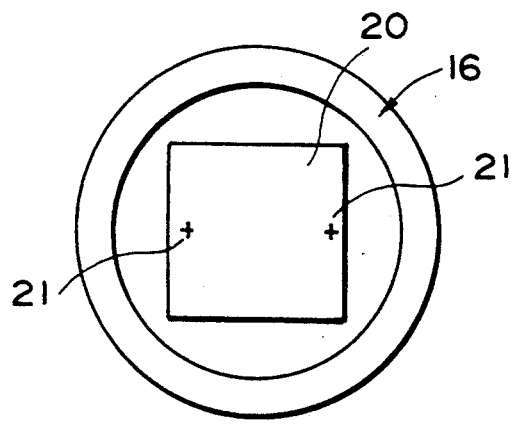
FIG. 5 is a plan view of a mask used with the embodiment of the present invention.
Figure 6:
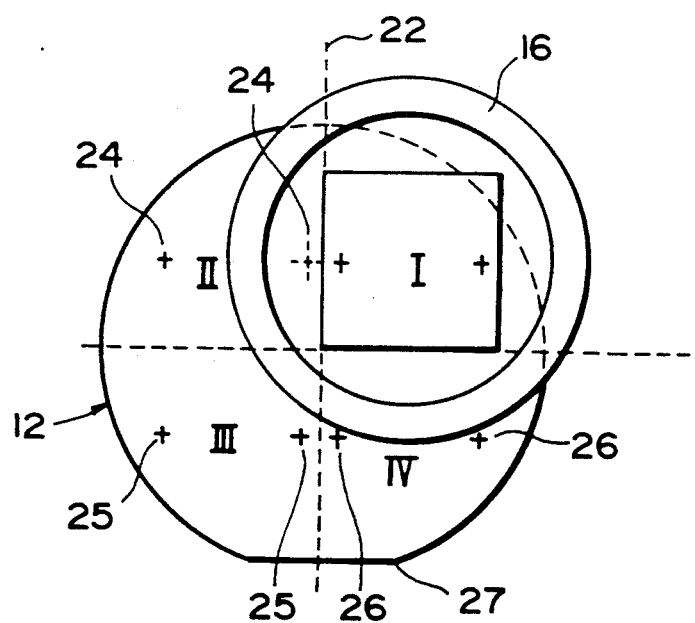
FIG. 6 is a plan view wherein a mask and a wafer are superposed in accordance with an embodiment of the present invention.

FIG. 5 is a plan view of a mask 16, which comprises a base plate transparent with respect to the X-rays, a circuit pattern 20 and a set of alignment marks 21 which are made of a material not transparent to X-rays. FIG. 6 is a plan view of the example of the wafer having separate four irradiation areas defined by the orthogonal broken lines 22 and 23. The irradiation is performed when the mask 16 is superposed with one of the separate irradiation areas of the wafer. Therefore, in order to cover the entire area of the wafer, the irradiation step must be repeated four times. The wafer may be provided with alignment marks which have been formed previously, and one set 24, 25 or 26 of alignment marks is formed on each of the irradiation areas.

The wafer 12 having those alignment marks 24, 25 and 26 are stacked in the wafer loading cassette 13. The wafers 12 are fed into the chamber 7 one by one by the feeding device, and then so oriented that an orientation flat 27 of the wafer 12 is directed toward a predetermined direction. Then, the wafer 12 is transferred to the wafer holder supported on the irradiation table, wherein the parallel plane setting device adjusts the position of the wafer 12 so that the surface of the wafer 12 is parallel with and spaced apart by a predetermined clearance from the wafer holder reference surface. As a result, the wafer 12 and the mask 16 which is supported by the mask holder placed on the wafer holder now have opposing surfaces which are parallel and spaced by a predetermined clearance.

The irradiation table carrying the wafer 12 is moved to the pre-alignment station which is located in the middle of the chamber portion 8.

On the other hand, the mask 16, which has been taken out of the mask cassette 15 and gripped by the mask handler and fixed on the mask holder, is received together with the mask holder by the coarse and fine movement device from the mask handler. The coarse and fine movement device carries the mask holder to the irradiation table which is waiting for it at the pre-alignment station with the wafer holder, and superposes them. At the pre-alignment station, the mask 16 and the first irradiation area of the wafer 12 are roughly aligned, and thereafter, they are moved to the adjacent fine alignment station to be subjected to a fine alignment operation.

The mask 16 and the wafer 12 on the irradiation table, which have been finely aligned, are transported into the irradiation chamber 5a, wherein they are scanned and irradiated by X-rays. The wafer 12 is covered or shielded at the second, the third and the fourth irradiation areas so as to prevent the areas other than the first irradiation area from being exposed to the X-rays.

The irradiation table, after passing through the irradiation chamber 5a, reaches the sub-chamber 6, where the irradiation area of the wafer is shifted. When the mask 16 is superposed with the second irradiation area of the wafer 12, the irradiation table is moved to the pre-alignment station and then to the fine alignment station in the sub-chamber 6. There, the mask 16 and the second irradiation area of the wafer 12 are roughly and then finely aligned with each other.

Similarly to the above described, the mask 16 and the wafer 12 are carried on the irradiation table into the irradiation chamber 5b, where they are scanned and irradiated with the X-rays. During the irradiation operation, the first, the third and the fourth irradiation areas are shielded so that only the second irradiation area is exposed to the X-rays.

When the irradiation table reaches the second main chamber portion 8 after passing through the irradiation chamber 5b, the irradiation area of the wafer 12 is again changed. Thus, the above described operations are repeated until the third and the fourth irradiation areas are exposed so that the entire surface of the wafer 12 is exposed to the X-rays. Then, the irradiation table is moved from the second main chamber portion 8 to the first main chamber portion 7. The wafer, which has been exposed to circuit patterns, is discharged and received by the wafer unloading cassette 14 in the chamber 3. If another mask 16 is to be used, the mask moving device can return the old mask to the cassette 15 and take another mask from the cassette out.

The foregoing description has been made with respect to a single wafer to be processed, but it will be understood that plural wafers 12 are processed in parallel using the plural irradiation tables.

Next, detailed explanations will be made as to the major points of operation to make clear the entire operation of the X-ray exposure apparatus according to this embodiment of the present invention.

(1) Wafer Loading, Parallel Plane Setting and Wafer Unloading

As shown in FIG. 4, the wafer loading cassette accommodating chamber 2 and the wafer unloading cassette accommodating chamber 3 are connected to the opposite sides of the first main chamber portion 7. In the loading chamber 2, a table 30 is mounted to support the wafer cassette 13 containing a plurality of wafers 12 each coated with a resist sensitive to the X-rays. The table 30 is supported on a lifter 31 for vertically moving the cassette 13. The cassette 13 supported on the table 30 is moved downwardly by the lifter 31, after a wafer 12 therein is fed into the first main chamber portion 7.

The loading chamber 2 is provided with a connection which is connected to a pipe 10 which, in turn, connected to a vacuum pump 50 to evacuate the loading chamber. On the inside surface of the top wall of the loading chamber 2, a heating device 51 is mounted to heat the inside of the chamber 2.

The loading chamber 2 is isolatable from the first main chamber portion 7 so that the evacuation can be effected only for the loading chamber 2. By this evacuation, the gases contained in the wafer surface layer can be removed preliminarily. In this sense, the loading chamber 2 also functions as a preliminary exhausting chamber in this embodiment. Also by this preliminary evacuation, there is no or at least reduced possibility that the gases are emitted within the X-ray exposure apparatus, more particularly, adjacent to the X-ray generating source, so that the vacuum in the apparatus is not disturbed at the step of the exposure of the mask 16 and the wafer 12.

Without the preliminary exhausting chamber, the volume to be evacuated is large, resulting in a longer time required for the evacuation. To reduce the required time, a larger pump having a higher evacuating speed is needed, which requires a larger space and which makes the operation costly.

Since the wafer loading cassette accommodating chamber 2 functions also as the preliminary exhausting chamber according to this embodiment, the space required is reduced so that the apparatus may be made smaller and that a mechanism not required for feeding the wafer cassette 13 from a preliminary exhausting chamber to the wafer loading chamber. This reduces the number of parts and improves the operability, and furthermore, the apparatus is less expensive.

The gases which can be emitted in the apparatus are contained not only in the wafer 12 but also in the inner wall surface of the chamber 2 and the wafer cassette 13. However, according to the embodiment of the present invention, there is provided the heater 51 so that those gases are quickly emitted by the heating, and evacuated by the vacuum pump 50.

As for the heating means for the loading chamber 2, a seath heater, an infrared and a posistor may be used. Among those elements, the posistor is suitable in that it has a self-temperature-keeping property, which makes the control of the heat source easier.

When the loading chamber 2 is heated, the main part of the X-ray exposure apparatus can be heated by the heat which is intended for the chamber 2. It is, therefore, preferable that the loading chamber 2 and the main part of the apparatus are thermally isolated. For example, the wall of the isolating valve between the loading chamber 2 and the first main chamber portion 7 may be provided with a pipe 52, in which a proper substance flows. FIG. 7 shows the wafer feeding device 32 according to an embodiment of the invention, which serves to feed the wafer 12 from the cassette 13 to the first main chamber portion 7. The feeding device 32 comprises a movable table 33 for supporting thereon the wafer 12 and drawing it out of the cassette 13 and a slide 35 for guiding for a horizontal movement along a guide 34. The wafer 12 carried on the table 33 is moved by the operation of the slide 35 to above a wafer lifter 36. The wafer lifter 36 is provided with a wafer supporting surface 37 which is rotatable and provided with an orientation flat detector 38 at a portion which is lower than the supporting surface 37. When the wafer 12 reaches the lifter 36, the lifter 36 is driven to lift the supporting surface 37 so that the supporting surface 37 receives the wafer 12 from the table 33. At this time, the supporting surface 37 is rotated to direct the orientation flat 27 in a predetermined direction with the aid of the orientation flat detector 38.

FIG. 8 shows the wafer hand 40, which grips the wafer 12 supported on the supporting surface 37 lifted by the lifter 36. The wafer hand 40 is connected to a slide 42 which is slidable along the guide 41, and also connected to a vertical cylinder 43 which is vertically movable.

The wafer hand 40 is moved to above the wafer supporting surface 37 by moving the slide 42 along the guide 41, and moved downwardly by operating the vertical cylinder 43. After receiving the wafer 12 from the supporting surface 37, the wafer hand 40 is moved upwardly by the vertical cylinder 43 operation and then moved along the guide 41 to the parallel plane setting station 44 (FIG. 4).

Figure 9:
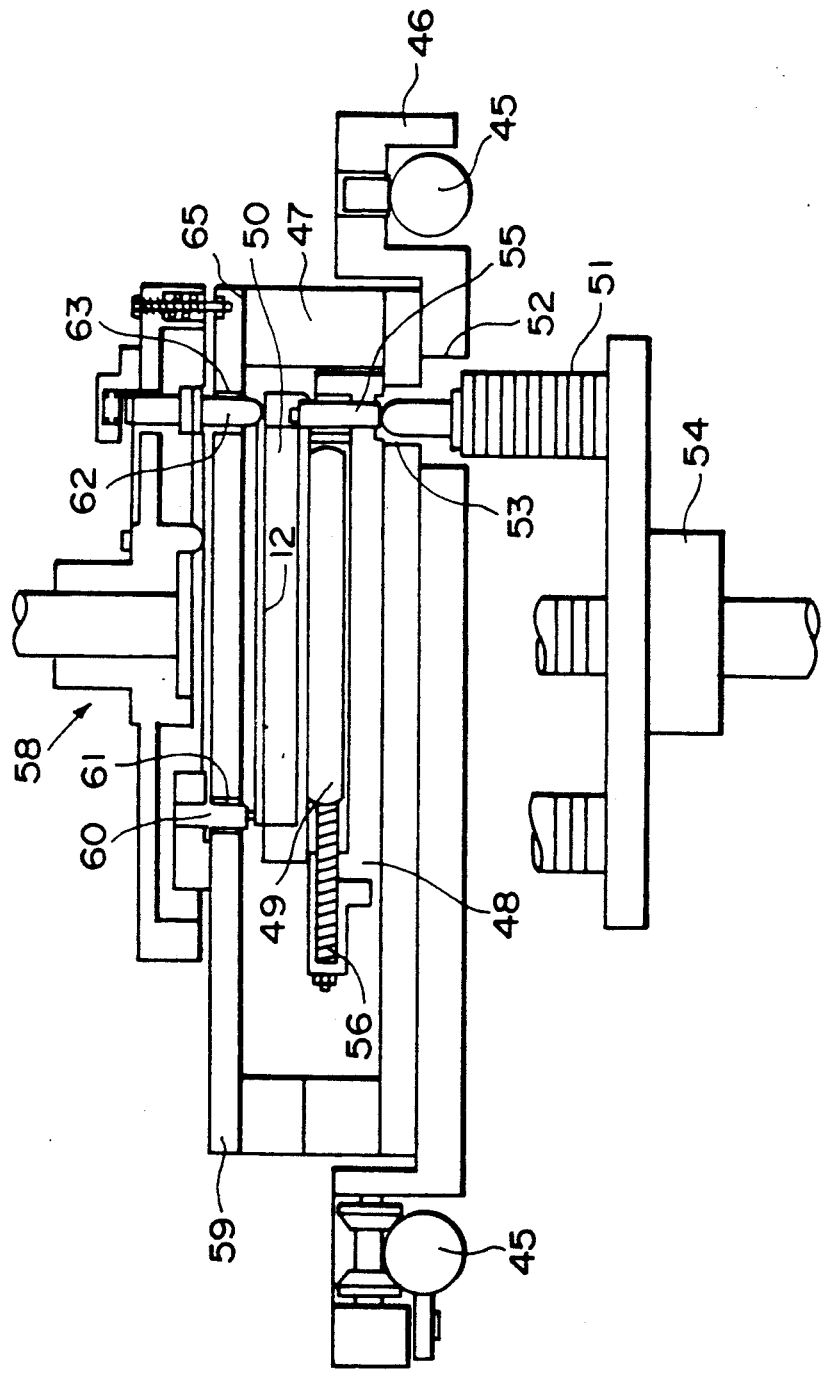
FIG. 9 is a cross-sectional view of a parallel plane setting mechanism according to an embodiment of the present invention.

At the parallel plane setting, station 44, the irradiation table 46 is prepared to receive the wafer 12, which table is movable along the rails 45 and 45. As shown in FIG. 9, the irradiation table 46 includes, at its upper portion, a wafer holder 47. Within the wafer holder 47, there is an irradiation area moving table 48, spherical seat 49 and a wafer chuck 50 in the order named from the bottom toward the top thereof. The spherical seat has such a configuration that is defined by a part spherical side surface and parallel surfaces equidistantly spaced from the center of the sphere.

Bottom walls of the irradiation table 46 and the wafer holder 47 have aligned openings 52 and 53, through which piezoelectric means extends. Preferably, each of the bottom walls has three such openings. Three piezoelectric elements 51 are mounted on a vertically movable supporting table 54 at such positions as are aligned with the openings.

The wafer chuck 50 is provided, at the bottom thereof, with a rod 55 extending downwardly to be engageable with a top of the piezoelectric means 51 which extends through the openings 52 and 53 into the wafer holder 47. The spherical seat 49 is fixedly mounted on the wafer chuck 50 and engaged, at its circumference, by piezoelectric means 56.

At the parallel plane setting station 44, there is a calibrator 58 which is vertically movable by the lifter 57 mounted at an upper part of the main chamber portion 7. The calibrator 58 includes a bottom plate 59, having an opening 61 through which a gap sensor 60 extends and an opening 63 through which chuck urging means 62 extends.

The wafer 12, when carried to the parallel plane setting station 44 by the wafer hand 40, is placed between the wafer holder 47 and the calibrator 58. Then, the cylinder 43 is actuated to lower the wafer hand 40 toward the chuck 50. When the wafer 12 comes close to the upper surface of the chuck 50, the wafer hand 40 releases the wafer 12 so that the wafer 12 is now supported on the upper surface of the chuck 50. The wafer 12 is secured on the chuck 50 by an electrostatic force.

The wafer hand 40, after dispensing the wafer 12 to the chuck 50, moves upwardly by the cylinder 43 and moves toward chamber 2 by driving the slide 42 along the guide 41.

The parallel plane setting operation for the wafer 12 secured on the chuck 50 will be explained. First, the lifter 57 lowers the calibrator 58 until the bottom surface of the bottom plate 59 thereof is engaged to a top reference surface 65 of the wafer holder 47.

Then, the piezoelectric means supporting table 54 is driven to lift the piezoelectric element 51 through the openings 52 and 53, until they reach the bottom end of the rod 55. At that time, the gap sensor 60 determines the distance between the upper surface of the wafer 12 and the top reference surface 65 of the wafer holder 47. In accordance with the determination, the piezoelectric means 51 adjust the vertical positions of the wafer so that the parallel plane setting is effected to the wafer 12. Then, the circumferential piezoelectric means 56 is actuated to urge it to the spherical circumference of the spherical seat 49 and fix the spherical seat 49, and therefore, the chuck 50.

Subsequently, the lifter 57 lifts the calibrator 58 to its upper position, and the supporting table 54 lowers the piezoelectric means 51. The irradiation table 46 carrying the wafer holder 47 is then transported from the parallel plane setting station 44 to the pre-alignment station along the rails 45 and 45 by a driving means (not shown).

The unloading of the wafer after the irradiation operation will now be described. The wafer unloading cassette accommodating chamber 3 has a table 30 for carrying the cassette 14 for accommodating the wafers, similarly to the wafer loading cassette accommodating chamber 2. The table 30 is supported by a lifter 31. The cassette 14 supported on the table 30 is moved upwardly by the lifter 31 after each time of receiving the wafer from the first main chamber portion 7.

The movement of the wafer 12 from the first main chamber portion 7 to the cassette 14 is effected by the wafer hand having the same structure as shown in FIG. 8 and the wafer discharging device 66 which is shown in FIG. 10. The discharging device 66 includes a table 67 and a slide 68.

As shown in FIG. 11, the irradiation table 46, after having been subjected to the X-ray irradiation, is deprived of the mask holder 70 by the mask hand 71 and then transferred to the wafer hand along the rails 45 and 45. There, the wafer 12 carried on the wafer chuck 50 is gripped by the wafer hand at its circumference and transferred onto the table 67 of the wafer discharging device 66. The table 67 carrying the wafer 12 is moved by the slide 68 along the guide 69 toward the cassette 14 in the chamber 3. By repeating those steps, the wafers 12 which have been exposed are successively accommodated in the cassette 14 within the chamber 3.

(2) Loading and Unloading of Mask

The loading and unloading of the mask will now be described in conjunction with FIGS. 3 and 11.

The mask cassette 15 includes a top cover 15a and a bottom cover 15b for accommodating in the space therebetween a plurality of masks 16. More particularly, they are supported on the top cover 15a by a magnetic force.

The mask cassette, when accommodated in the mask cassette accommodating chamber 4, can be opened by lowering the bottom cover 15b by driving an opening device 72.

The top cover 15a of the mask cassette 15 is rotated by a rotating means so that a desired or needed mask 16 from the accommodated plural masks can be positioned at an access position where the mask is taken out or taken back.

A cover 75 of the chamber 4 is opened, and a cassette 15 is set in the chamber 4, and then the cover 75 is closed. Then, the chamber 4 is evacuated by evacuating means (not shown). When the degree of the vacuum in the chamber 4 reaches a predetermined level, a sliding valve 76, which has been closed, is opened, and a mask moving member accesses therethrough to the chamber 4 from the second main chamber portion 8. The mask moving member has, at its end, a pawl to draw a mask 16 out which is supported on the top cover 15a of the cassette 15 by a magnetic force. The pawl is engaged with a desired or selected mask 16, and then the top cover 15a is moved upwardly by the lifter 74b so that the mask 16 is taken out from the top cover 15a. The mask moving member is withdrawn into the second main chamber portion 8 so that the mask 16 is moved from the chamber 4 to the second main chamber portion 8, more particularly, to a mask stage 77.

At the mask stage 77, there are provided a mask handler 78, a mask position sensor for detecting the position of the mask and a mask lifter 80 for lifting the mask while it is being supported by the mask handler 78.

The mask handler 78, which is effective to support the mask which is at the stage 77 on the mask moving member, is rotatable to position the mask in accordance with the result of the detection of the mask position by the sensor 79.

After the mask 16 is correctly positioned, the mask handler 78 supporting the mask 16 is moved upwardly by the lifter 80.

The sensor 79 is movable horizontally so that, when the position of the mask is to be detected, the sensor 79 is positioned above the mask 16 supported by the handler 78, and when the correct positioning of the mask is achieved, it is retracted to its initial position. Therefore, it does not impede the vertical movement of the mask handler 78.

Right above the mask stage 77, there is a mask holder hand 71. The mask holder hand 71 includes engaging members 81 and 81 for clamping the mask holder 70 and shaft members 82 and 82 for moving the mask holder 70 while it is clamped by the engaging members 81 and 82. The shaft members 82 and 82 are moved vertically by the lifter 83 located at an upper position of the main chamber 8. The engaging members 81 and 81 are rotatably connected with the shaft members 82 and 82, so as to rotate, when receiving the mask holder 70 after the termination of the irradiation operation, to allow the holder 70 to pass and engage with one of the engaging members 81. Then, the engaging member 81 which has been away from the mask holder 70 passage by its rotation is again rotated to clamp the mask holder 70 by the two engaging members 81 and 81.

The mask holder 70 clamped by the mask holder hand 71 is provided with an opening 84 for partially accommodating the mask 16 which is moved upwardly while being supported by the mask handler 78, and provided, at the bottom thereof with a magnetic member for holding the mask 16 by a magnetic force. The mask 16 which is moved upwardly by the mask lifter 80 while being supported by the mask handler 78 is supported by the mask holder 70, and on the other hand, the handler 78 moves downwardly by the mask lifter 80 after it releases the mask 16.

Next, the mask 16 supported by the mask holder 70 is returned to the cassette 15.

First, the mask lifter 80 is actuated to move the mask handler 78 to the neighborhood of the mask 16 held under the mask holder 70. The handler 78 is actuated to grip the mask 16. The magnetic member mounted in the bottom of the holder 70 is deenergized. The mask is released from the holder 70, and then, the lifter 80 is actuated to lower the mask 16 while it is being gripped by the handler 78.

The pawl of the mask moving member receives the mask which is gripped by the handler 78 and located at the mask stage 77. At this time, the mask handler 78 is actuated to release the mask when the pawl receives the mask. Thereafter, the mask moving member is extended into the chamber 4, so that it is disposed between the top cover 15a and the bottom cover 15b of the cassette 15.

The magnetic member provided on the top cover 15a of the cassette 15 attracts the mask 16 which is on the end of the mask moving member, to the lower surface of the top cover 15a.

(3) Irradiation Table and Movable Carriage

Figure 12:
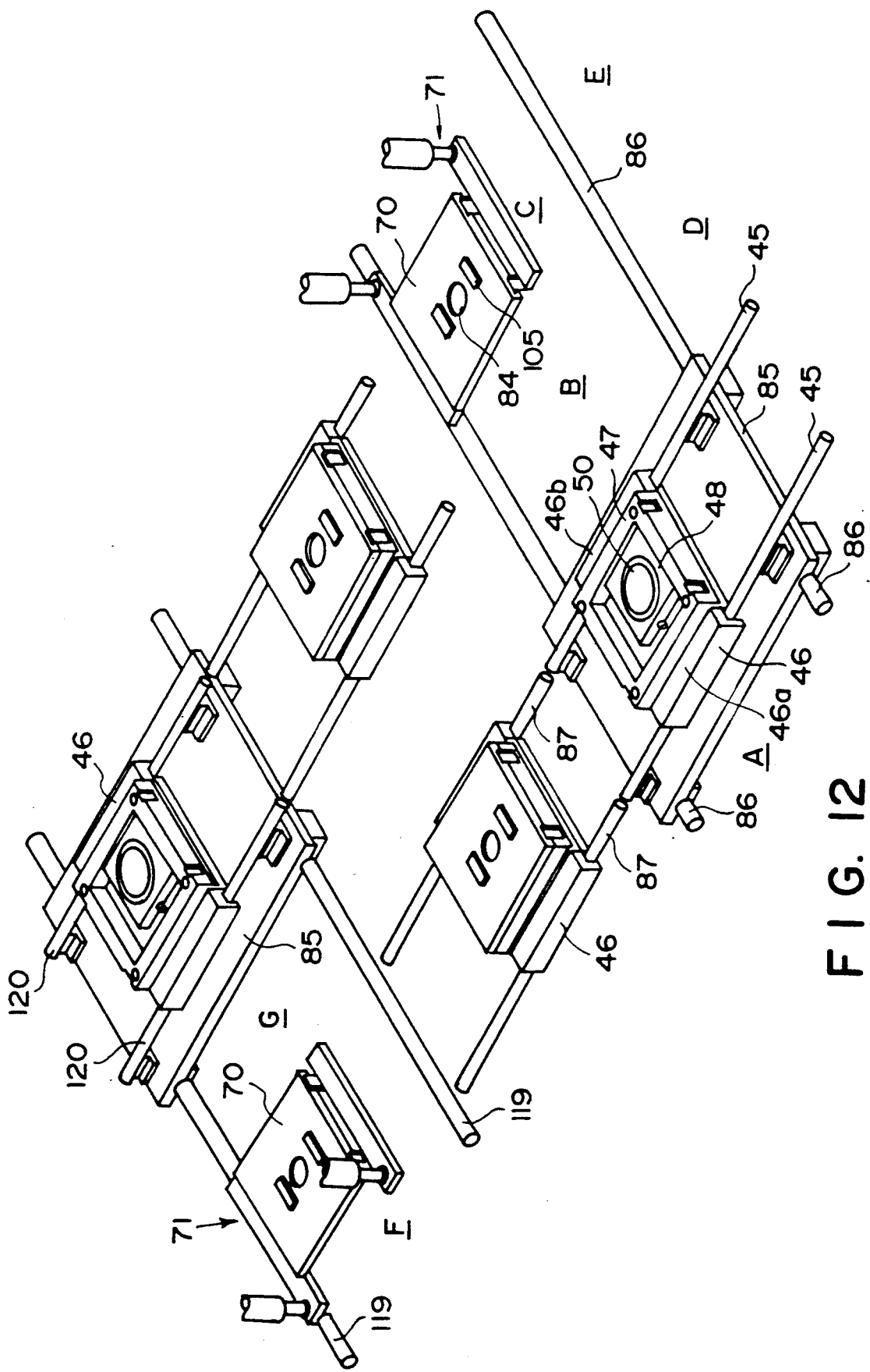
FIG. 12 is a perspective view illustrating movements of a carrying-table and an irradiation table according to an embodiment of the present invention.

Referring to FIG. 12, the irradiation table and the movable carriage will be explained. The movable carriage 85 is movable along the longitudinal rails 86 and 86 by a driving mechanism (not shown). The length of the longitudinal rail 86 is such that the movable carriage 85 is movable between the fine alignment station A and the mask loading and unloading station C. On the movable carriage 85, lateral rails 45 and 45 are fixedly secured, along which the irradiation table 46 is movable. One end of each of the rails 45 and 45 is so determined that, when the irradiation table 46 is at the fine alignment station A, it is connectable with each of relay rails 87 and 87, while the other end is so determined that, when the irradiation table 46 moves along the lateral rails, the irradiation table 46 can take the wafer to loading position D and the wafer unloading position E. Therefore, when the movable carriage 85 is at the pre-alignment position B, and the irradiation table 46 moves away from the movable carriage 85 along the lateral rails 45 and 45, the irradiation table 46 reaches the wafer loading station D. Similarly, when the movable carriage 85 is at the mask loading and unloading station C, and the irradiation table 46 moves away from the movable carriage 85 along the lateral rails 45 and 45, the irradiation table 46 reaches the wafer unloading station E. The wafer holder 47 is shown as being supported by the magnetic chuck on the irradiation table 46, and provided with a regular square recess, within which an irradiation area changing or shifting table 48 is movable. The relative movement between the wafer holder 47 and the irradiation area changing table 48 will be described hereinafter. Above the table 48, there is a wafer chuck 50 for chucking the wafer.

Above the movable carriage 85 and the irradiation table 46, there is provided a coarse and fine movement device 84 which is movable as a whole in the lateral direction.

Figure 13:
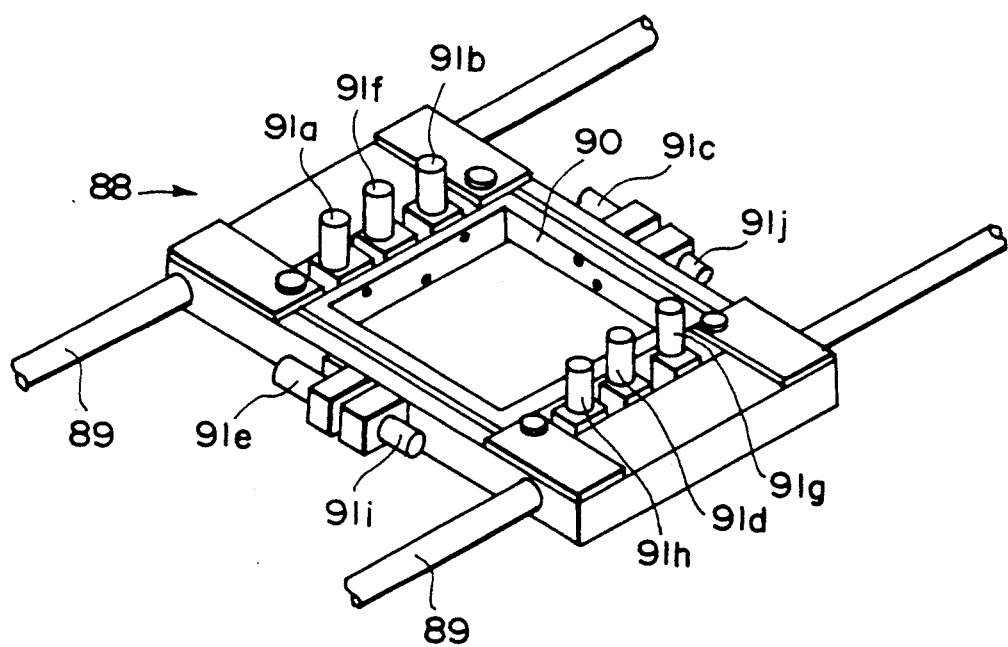
FIG. 13 is a perspective view of a coarse and fine movement device according to an embodiment of the present invention.

FIG. 13 is a perspective view of the coarse and fine movement device 88, which serves to place the mask 16 and the wafer 12 into alignment with each other, and which is movable along another set of lateral rails 89 and 89 parallel with the lateral rails 86 and 86.

Figure 14:
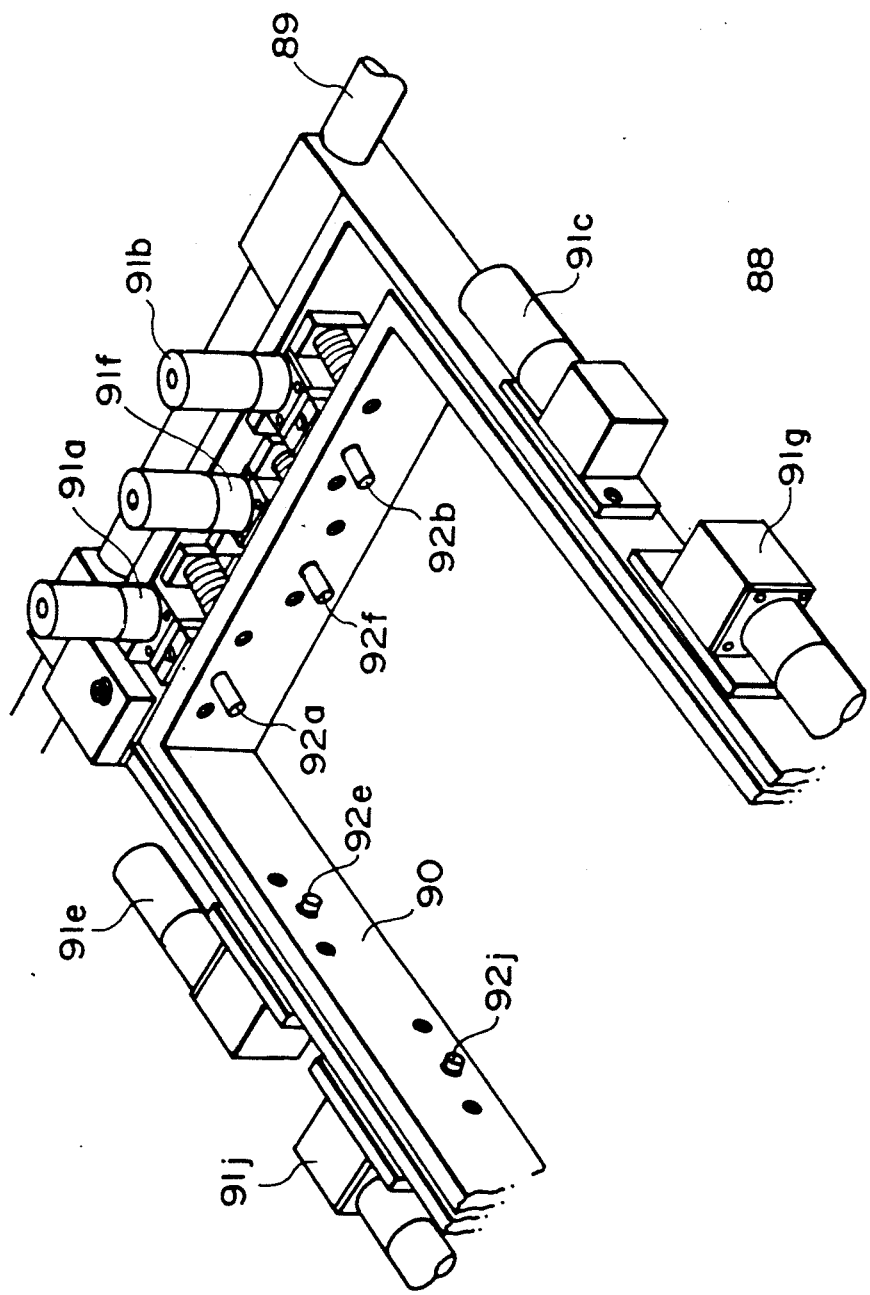
FIG. 14 is a more detailed perspective view of the coarse and fine movement device of FIG. 13.
Figure 15:
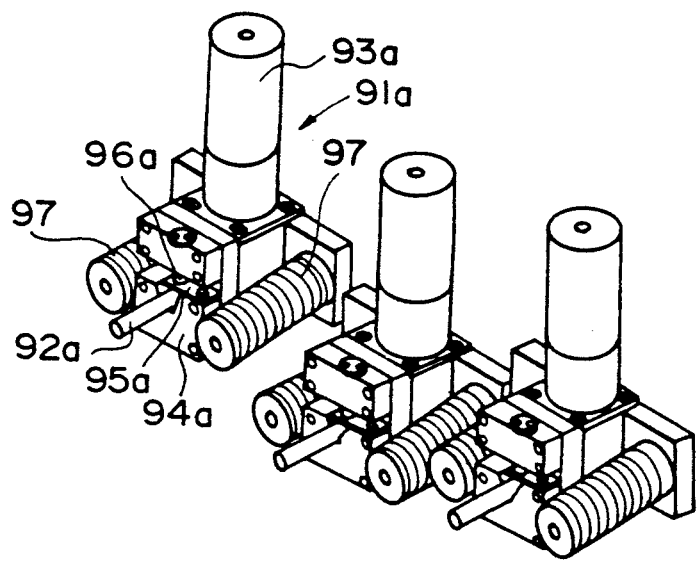
FIG. 15 is a perspective view of a coarse and fine movement mechanism used with the device of FIG. 13.

FIG. 14 shows in more detail the coarse and fine movement device 88. It comprises a coarse movement frame 90 which is suspended at four portions from the beam through which the lateral rails 89 and 89 extend. Between the beam and the frame there is provided a compression spring for absorbing collision energy and to fix the frame at the lower position. Into the frame 90, the mask holder 70 and the wafer holder 47 are moved by a movable carriage lifter (not shown) which will be described hereinafter. To the outside of the coarse and fine movement frame 90 are coarse movement mechanisms 91a and 91b supported by stacked piezoelectric elements. Each of the coarse movement mechanisms 91a and 91b has a pushing rod 92a which extends into the frame 90. As shown in FIG. 15, the coarse movement mechanism 91a comprises a coarse movement motor 93a and a combination of a rack and pinion. The rotational movement caused by the motor 93a is converted to a rectilinear movement of the pushing rod 92a. The pushing rod 92a is journaled by a combination of V-channel formed on a block 94a and a cantilevered leaf spring 95a which urges the pushing rod 92a at its upper side. The leaf spring 95a is pressed by a piezoelectric element rod 96a. When the piezoelectric element rod 96a is energized, the pushing rod 92a is pressed through the leaf spring 95a so that it is clamped to the block 94a. Stacked piezoelectric elements 97 and 97 are effective to move back and forth the coarse movement mechanism 91a. One end thereof is securely fixed to the coarse movement mechanism 91a, while the other end is fixed to the external side of the coarse and fine movement frame 90. Also, another coarse movement mechanism 91b which has the structure similar to the above is mounted to the external side of the coarse and fine movement frame 90 by piezoelectric elements.

Figure 16:
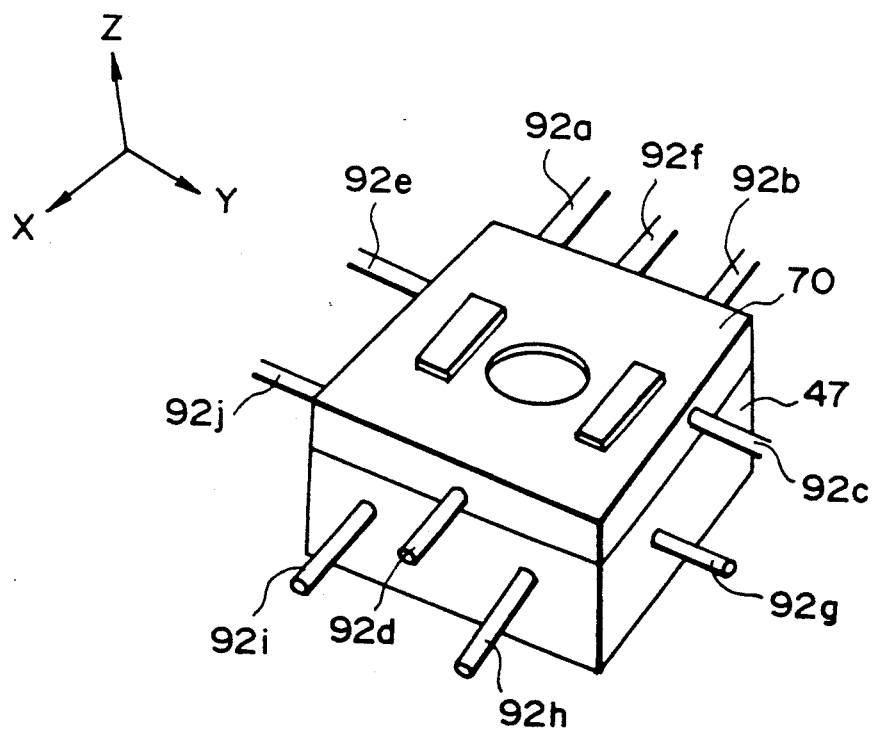
FIG. 16 is a perspective view illustrating operation of the coarse and fine movement device.

The coarse and fine movements will be described in conjunction with FIG. 16. Designated by reference numerals 92a, 92b, 92c, 92d and 92e are pushing rods extending out of the upper part of the coarse and fine movement frame 90. Those pushing rods are engageable to the mask holder 70. Designated by reference numerals 92f, 92g, 92h, 92i and 92j are pushing rods extending out of the lower part of the frame 90. Those pushing rods are engageable to the wafer holder 47. The pushing rods 92a and 92b are engageable to one side of the mask holder 70, and the pushing rod 92d is engageable to the opposite side, thus clamping the mask holder 70. The other sides of the mask holder 70 are engaged by the pushing rods 92c and 92e. Similarly, the wafer holder 47 is clamped by the pushing rod 92f and the pushing rods 92h and 92i which are opposed to the pushing rod 92f, and by the pushing rod 92g and the pushing rod 92i which is opposed thereto. When, for example, the position of the mask holder 70 is adjusted in X, Y and $\theta$ directions, the pushing rods 92c and 92e are slightly loosened, and the pushing rod 92d and a couple of pushing rods 92a and 92b are interrelatedly pushed or retracted to adjust it in the X direction. For the pushing and retracting operations, the coarse movement motor 93a is driven at an initial stage to move the pushing rod 92a back and forth to effect the coarse adjustment, and then the piezoelectric element rod 96a is driven to clamp the pushing rod 92a. Subsequently, the stacked piezoelectric elements 97 are energized to finely move the coarse movement mechanism 91a back and forth, so that the mask holder 70 is positioned with high precision. For the adjustment in the Y direction, the pushing rod 92e and the pushing rod 92c are interrelatedly moved.

For the adjustment in the $\theta$ direction, the pushing rods 92c and 92e are slightly loosened, and the pushing rods 92a and 92b are moved with the result that the mask holder 70 rotates about the tip of the pushing rod 92d. In a like manner, the wafer holder 47 is adjusted in its position.

(4) Pre-Alignment and Fine Alignment

Referring back to FIG. 12, the pre-alignment and fine alignment operations will be described. First, at the mask loading and unloading station C, the mask holder 70 loaded with the mask 16 is mounted on the coarse and fine movement device 88. To effect this, the mask holder hand 71 is once lowered, and then the coarse and fine movement device 88 is moved to the mask loading and unloading station C, where the coarse and fine movement device 88 is aligned above the mask holder 70. Then, the mask holder hand 71 is lifted to set the mask holder 70 in the coarse and fine movement frame 90 of the coarse and fine movement device 88. The mask holder 70 is clamped by pushing the pushing rods 92a-92e.

On the other hand, the wafer 12 is loaded to the wafer chuck 50 at the wafer loading station D. After termination of the parallel plane setting step, the irradiation table 46 is moved along the lateral rails 45 and 45 to the pre-alignment station B. During this movement, the coarse and fine movement device 88 is moved along the longitudinal rails 89 and 89 (FIG. 13) to the pre-alignment station B so that it is superposed with the wafer holder 47.

Figure 3:
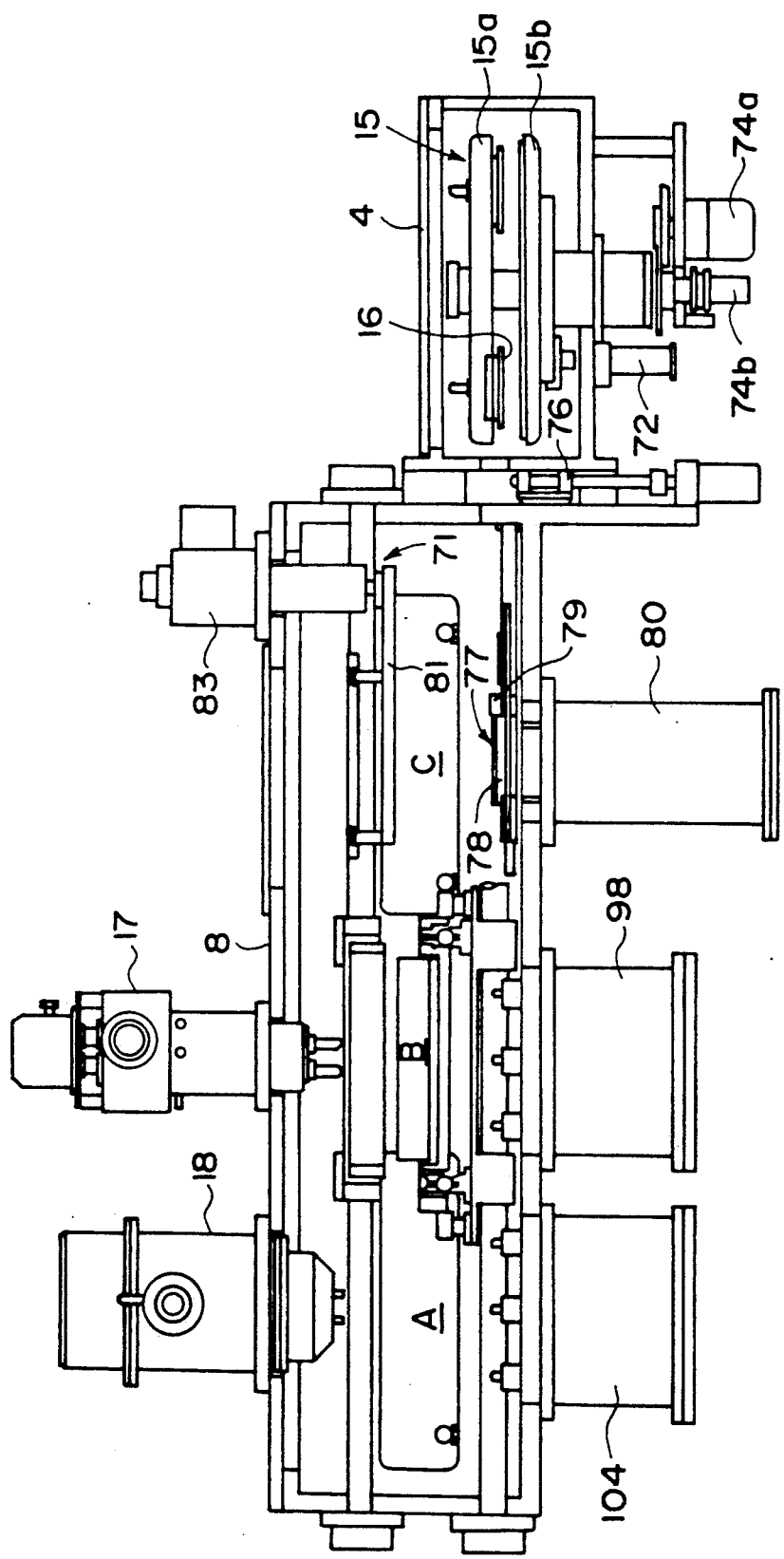
FIG. 3 is a cross-sectional view taken along the line II—II of FIG. 1.
Figure 4:
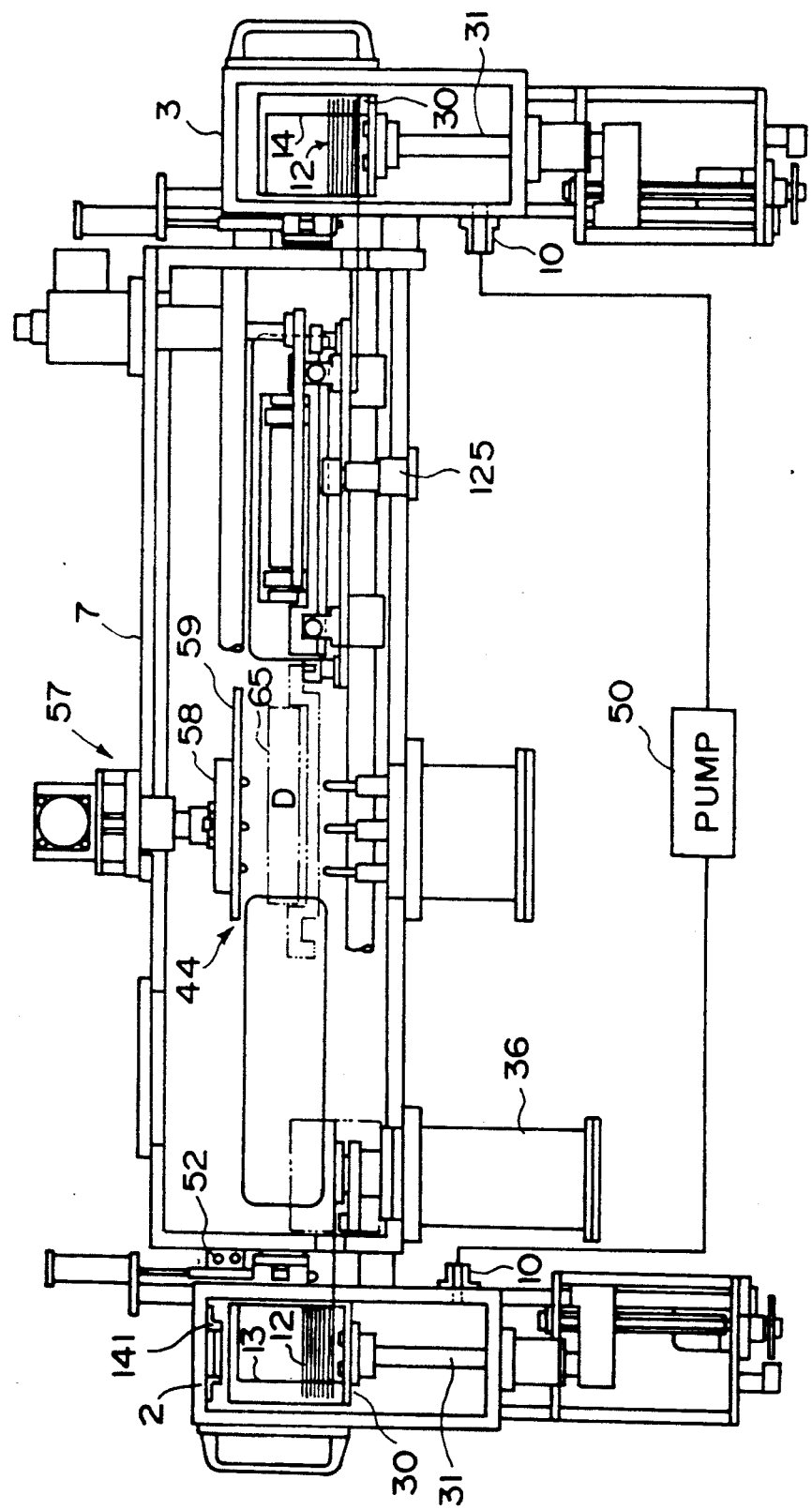
FIG. 4 is a cross-sectional view taken along the line III—III of FIG. 1.

The irradiation table lifter mechanism 98 shown in FIG. 3 is operated to raise the irradiation table 46 by a raising rod having three pawls through an aperture (not shown) provided in the middle of the movable carriage 85. By this, the reference surfaces 46a and 46b on the irradiation table 46 are urged toward the reference surface of the frame of the coarse and fine movement device 88, which surface faces downward, to effect height determination and equalization.

Figure 17:
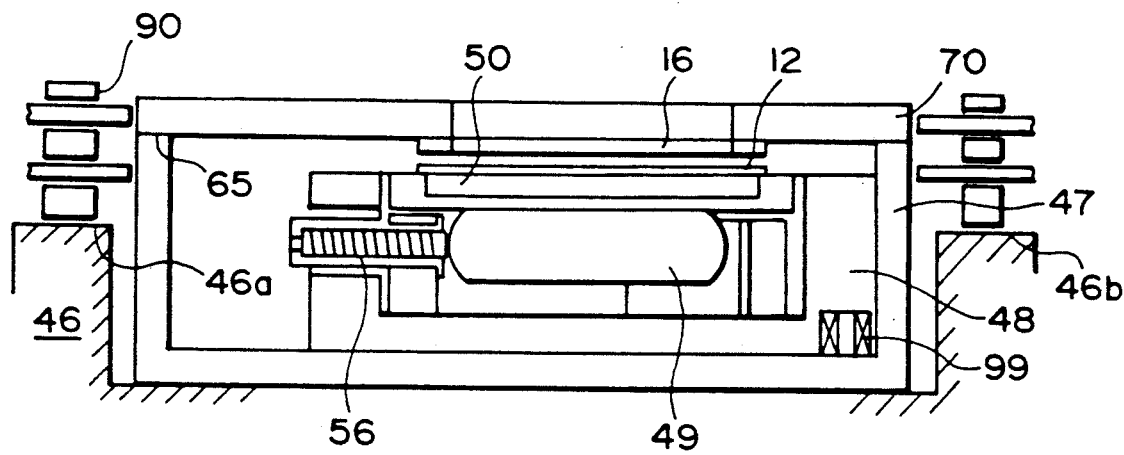
FIG. 17 is a cross-sectional view of a mask holder and a wafer holder which are superposed, according to an embodiment of the present invention.

FIG. 17 shows the state wherein the mask holder 70 and the wafer holder 47 are coupled by an electrostatic chuck (not shown). Since the parallel plane setting of the wafer surface and the setting of the gap from the upper surface 65 (reference surface) of the wafer holder 47 have been effected, the lower surface of the mask 16 and the surface of the wafer 12 are placed in proximity with each other with a clearance, for example, several microns, if the upper reference surface 65 of the wafer holder 47 is engaged to the lower reference surface of the mask holder 70. At this time, the magnetic chuck between the irradiation table 46 and the wafer holder 47 releases, and the alignment operation between the mask 16 and the wafer 12 is performed in the manner which has been described in conjunction with FIG. 16.

The alignment mark on the wafer 12 is formed in a scribe line in order to save the effective area of the wafer. The accuracy of the final alignment between the mask 16 and the wafer 12 is required to be in the order of 0.1 micron or finer. To achieve this high precision alignment, this embodiment of the present invention employs a scanning type electron microscope. Therefore, during the alignment operation the alignment mark on the wafer is scanned by an electron beam. If the electron beam deflects to such a degree that it is beyond the width of the scribe line, the area in which the actual pattern is to be formed is undesirably exposed to the electron beam. For this reason, it is desirable that the mask 16 and the wafer 12 are aligned to the order of 10 microns before the fine alignment operation using the electron microscope, except for the case where the alignment mark is formed in a area exclusively for the alignment mark, or the case where the space between the adjacent actual pattern areas is relatively large as compared with the precision of the initial mechanical alignment.

Figure 18:
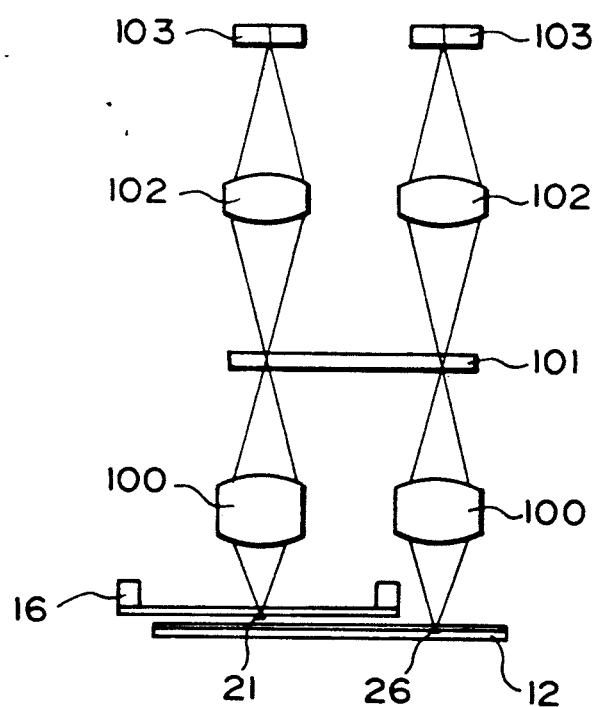
FIG. 18 shows an optical arrangement of a pre-alignment microscope according to an embodiment of the present invention.
Figure 19:
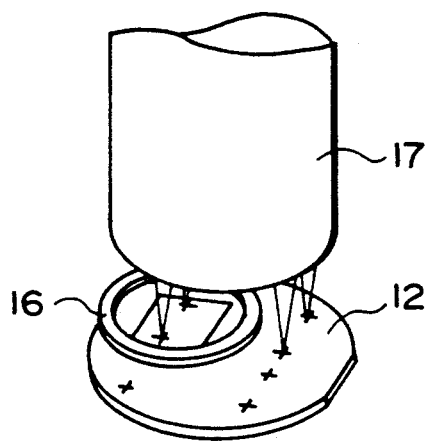
FIG. 19 is a perspective view illustrating an alignment operation between the mask and the wafer using the pre-alignment microscope of FIG. 18.

FIGS. 18 and 19 show schematically an arrangement of an optical microscope means 17 which is used for the pre-alignment. The optical microscope means 17 includes two microscopes for detecting the alignment marks 21 and 21 of the mask 16 and two microscopes for detecting the alignment marks 26 and 26 on the wafer 12 (one for each is shown in FIG. 18). Each of those four microscopes includes an objective lens system 100, an imaging lens system 102 and TV image pick-up device 103. As described hereinbefore, the mask holder 70 and the wafer holder 47 are independently adjusted in their position by the coarse and fine movement device 88, so that the alignment mark 21 and 21 of the mask 16 and the alignment mark 26 and 26 of the wafer 12 are aligned with respective reference marks on a scale 101. Thus, the mask 16 and the wafer 12 are pre-aligned, and then the mask holder 70 and the wafer holder 47 are once coupled by the electrostatic chuck, and the pushing rods 92a-92j of the coarse and fine movement device 88 are moved away from the mask holder 70 and from the wafer holder 47 to release them. Thereafter, the lifting rod of the irradiation table lifting mechanism 98 is lowered to bear the irradiation table 46 on the movable carriage 85.

When the movable carriage 85 is chucked with the irradiation table 46, the movable carriage 85 moves to the fine alignment station A. By that time, the coarse and fine movement device 88 is moved to the fine alignment station A. The irradiation table lifter 104 at the fine alignment station A is actuated to lift the irradiation table 46. This lifter mechanism 104 is preferably of, for example, a cam-follower mechanism, since then the acceleration can be zero at the top position of the lifter so that an abrupt collision between the mask holder 70 and the wafer holder 47 can be avoided.

The pushing rods 92a-92j of the coarse and fine movement device 88 again clamp the mask holder 70 and the wafer holder 47, and the magnetic attractions between the mask holder 70 and the wafer holder 47 and between the wafer holder 47 and the irradiation table 46 are removed. Then, the electron microscope 18 for the fine alignment starts to detect the alignment marks.

Figure 20:
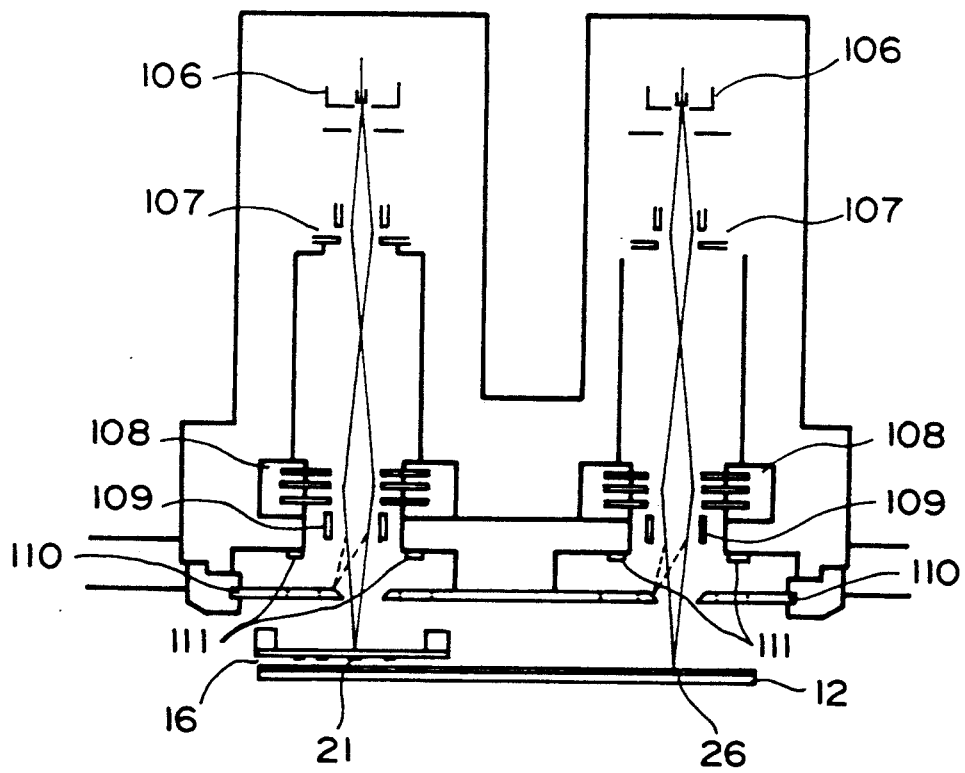
FIG. 20 is a schematic cross-section of an electron microscope for fine alignment according to an embodiment of the present invention.

FIG. 20 shows schematically an arrangement of the electron microscope 18 for the fine alignment. The fine alignment electron microscope 18 includes independently operable four scanning type electron microscopes. Two of them are for detecting the alignment marks 21 and 21 of the mask 16. The rest detect the alignment marks 26 and 26 of the wafer through the window 105 of the mask holder 70 (one for each is shown in FIG. 20). The window 105 is closed when the wafer 12 is irradiated by the X-rays in the irradiation chamber 5a or 5b.

An electron gun 106 generates an electron beam. The electron microscope includes a condenser lens 107, an objective lens 108 and an electrostatic deflector for deflecting the electron beam in two dimensions. The thus produced two dimension scanning electron beam is directed through a slit formed in a reference plate 110 to the alignment marks on the mask 16 and the wafer 12. The electrons reflected by the mask 16 and the wafer 12 are detected by a reflection electron detector 111. In accordance with the results of the detection, the mask 12 and or the wafer 16 are moved so that their alignment marks are positioned in the middle of the slit of the reference plate 110.

During these operations, the pushing rods 92a-92j of the coarse and fine movement device 88 control the positions of the mask holder 70 and the wafer holder 47. When all of the alignment marks are aligned with the axes of the corresponding electron microscope, the fine alignment is accomplished.

Then, the mask holder 70 and the wafer holder 47 are coupled by the magnetic chuck. The pushing rods 92a-92j of the coarse and fine movement device 88 are moved away from the mask holder 70 and the wafer holder 47 to release them. Then, the wafer holder 47 and the irradiation table 46 are chucked, whereafter the lifting rod of the irradiation table lifter 104 is lowered, until the irradiation table is beared on the movable carriage 85, which are then chucked with each other.

(5) Irradiation

Next, the irradiation will be explained, referring to FIGS. 1 and 2. The irradiation station is placed within a vacuum chamber which is independent from the other parts. The main chamber 1 and the sub-chamber 6 are connected through sealingly isolating valves 9 and 9 and flexible connections 112 and 112 like bellows. The isolating valve 9 is normally opened, but when, for example, the irradiation station is to be accessed, it is shut to maintain the vacuum of the other chamber, such as the main chamber 1.

The X-ray irradiation system comprises an X-ray tube 113 and soller slits 114a and 114b. The X-ray tube 113 includes a target 115 extending in the direction perpendicular to the sheet of the drawing of FIG. 2, an elongate electron guns 116 and 116 at those sides thereof and a deflecting plate 117. The deflecting plate 117 deflects the electron beam generated by the electron guns 116 and 116 to introduce it to the bottom of the target 115. The lengths of the electron guns 116 and 116 and the target 115 are slightly larger than the width of the mask 16 to be irradiated.

The soller slits 114a and 114b function to select a parallel component from the radiant soft X-rays generated by the target 115 to collimate them. The soller slit is a glass or metal plate of a thickness of an order of millimeter provided with a great number of fine openings of a diameter of the order of 10 microns. The generated soft X-rays contain the component which is parallel with the openings and the other components. The solar slit is effective to block the aforementioned other components. A plurality of the solar slits are used in order to meet the requirement for the resolution. When a mask to be used requires a high resolution, soft parallel, X-rays should be used, whereas, when the mask to be used does not require a high resolution, substantially parallel, X-rays of should be used with an increased amount of irradiation, so that the time required for the sufficient irradiation can be reduced. A selector 118 is a mechanism for exchanging the solar slits. The solar slit 114a for providing highly parallel soft X-rays and the solar slit 114b for providing a standard parallel can be interchanged without reducing the vacuum. The selector 118 can be operated at the outside of the chamber.

Figure 2:
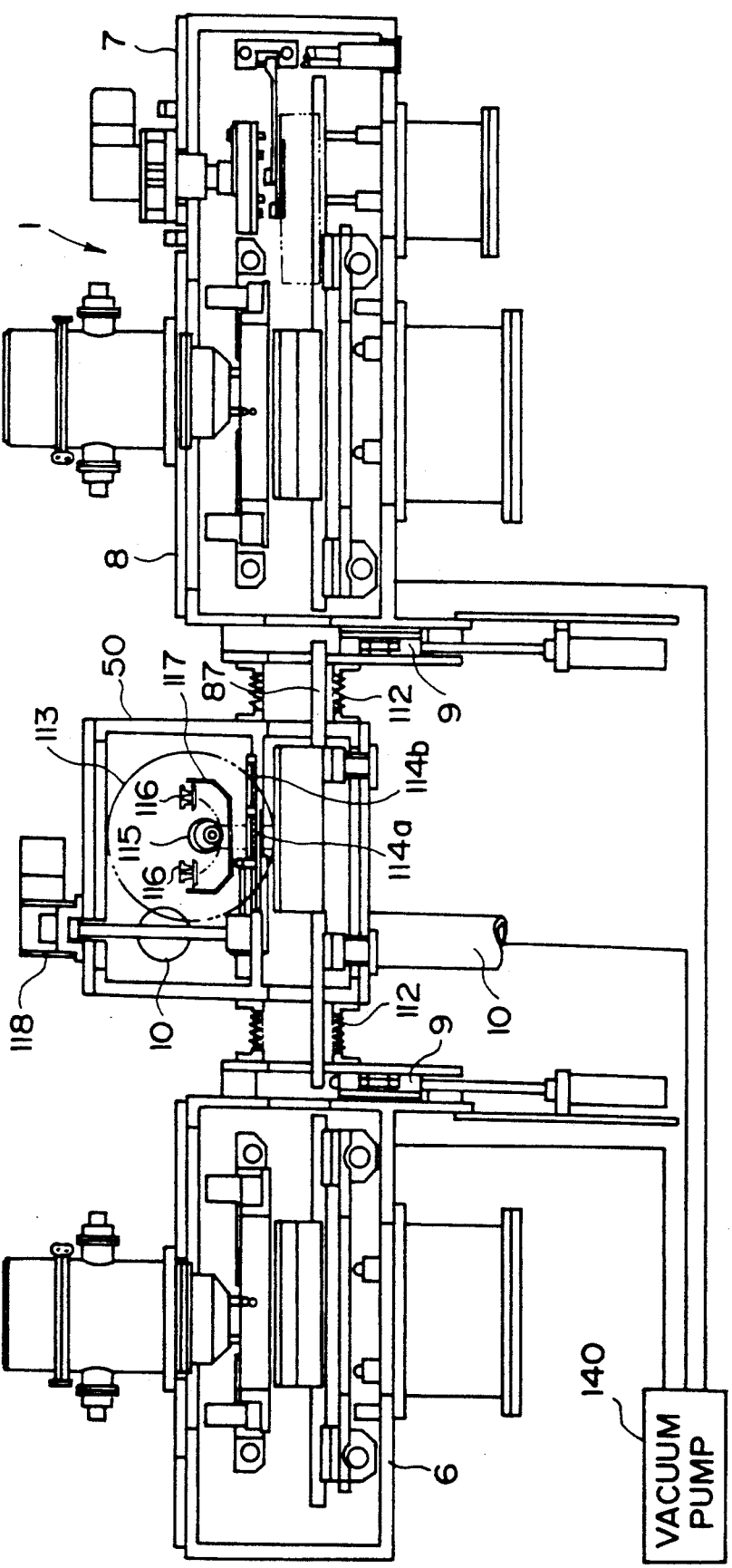
FIG. 2 is a cross-sectional view taken along the line I—I of FIG. 1.

As shown in FIG. 2 the relay rails 87 which have been described with FIG. 12 extend through the inside of the isolating valves 9 and 9. The relay rails serve to move, at a constant speed, the irradiation table 46 while carrying thereon the wafer holder 47 and the mask holder 70. The mask 16 and the wafer 12, which are supported in close proximity with each other, are moved through the parallel soft X-rays extending in the direction perpendicular to the sheet of drawing of FIG. 2 so that they are scanned by the X-rays. The mask 16 is thus exposed to the X-rays.

The vacuum of the irradiation chamber 5a, in use, is such that the X-ray tube 113 operates properly, namely, $1 \times 10^{-6}$ Torr. The mask 16 and the wafer 12 supported on the irradiation table 46 are also placed in such a vacuum. However, the vacuum in the space where the mask 16 and the wafer 12 are placed may be reduced to such an extent that the X-rays do not attenuate considerably, whereby the load of the vacuum pump can be reduced. To do this, the vacuum is $1 \times 10^{-3}$ Torr.

In the embodiment, the solar slit in the irradiation slit 5a is effective to function as a resistance to the air flow. Therefore, the two spaces divided by the solar slits may be exhausted by separate exhausting or evacuating means so that the upper space can be maintained at the vacuum of $1 \times 10^{-6}$ Torr.

(6) Irradiation Area Change

After the completion of the irradiation, the irradiation table 46 is transferred to the irradiation area changing or shifting station F. As shown in FIG. 12, an additional movable carriage 85 is movable along longitudinal rails 119 and 119. On the movable carriage 85, there are lateral rails 120 and 120 which are movable together with the movable carriage 85. Those members are accommodated in the sealed sub-chamber 6. The sub-chamber 6 is provided with a pre-alignment device and fine alignment device. It is of a similar construction to the main chamber 1 except that the mask and wafer loading and unloading stations are not provided.

As shown in FIG. 12, the second movable carriage 85, when the irradiation table 46 is approaching the ends of the relay rails 87 and 87, is at such a position that the lateral rails 120 and 120 are aligned with the relay rails 87 and 87. A second mask holder hand 71 functions to grip the mask holder 70 and lift the wafer holder 47, similarly to the aforementioned mask holder hand.

At the irradiation area changing station F, there is provided a irradiation area changing lift in addition to the second mask holder hand 71. In FIG. 21, the irradiation table 46, lateral rails 120 and 120, the movable carriage 85 and the longitudinal rails 119 and 119 have functions as have been explained. The second movable carriage 85 has a central opening, in the neighborhood of which a recessed member 121 is mounted. In the recessed member 121, stacked piezoelectric elements 122a and 122b are mounted, and thereabove, there are mounted solenoids 123a and 123b, respectively.

To the bottom of the irradiation area changing table 48, an attracting plate 124 having a bottom surface of magnetic material is mounted through a rod. The rod extends through openings formed in the wafer holder 47 and the irradiation table 46. The attracting plate 124 is movable within the openings. After the magnetic clamping between the irradiation area changing table 48 and the wafer holder 47, the piezoelectric element 122a are energized to expand, so that the top of the solenoid 123a raises the attracting plate 124 to space the irradiation area changing table 48 from the wafer holder 47 by 0.02-0.03 mm. Then, the solenoid 123a is actuated to fix the irradiation area changing table 48 to the movable carriage 85, and the irradiation table 46 is advanced along the lateral rails 120 and 120 by a predetermined amount. This advancement moves the wafer holder 47 together with the irradiation table 46, whereby the irradiation area changing table 48 is moved relative to the wafer holder 47, that is, the area to be irradiated is changed.

Thereafter, the solenoid 123a is deenergized, and the piezoelectric elements 122a are deactivated to be reduced, with the result that the irradiation area changing table 48 is beared on the wafer holder 47. Again, the irradiation area changing table 48 and the wafer holder 47 are fixed, so that they are prepared for movement to the second pre-alignment station G. Another set of the piezoelectric element 122b and the solenoid 123b is used for changing the irradiation area, when the irradiation table 46 comes back to this station again. Then, the same operations as described before are repeated. That is, the mask holder 70 is gripped by the second coarse and fine movement device (not shown) and moved to the pre-alignment station G, where it is superposed with the wafer holder 47 carried on the movable carriage 85. They are then pre-aligned and finely aligned. Subsequently, they are exposed to the X-rays.

Figure 22A:
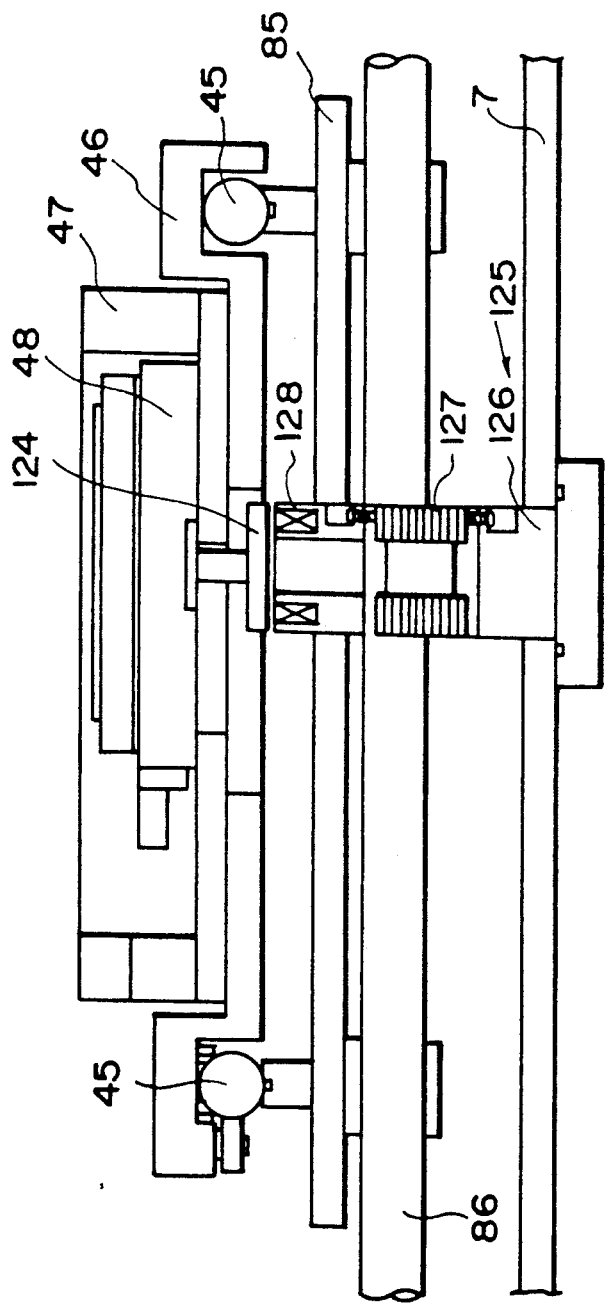
FIGS. 22A and 22B illustrate the movement of the wafer through the irradiation station by an irradiation station moving lift according to an embodiment of the present invention.
Figure 22B:
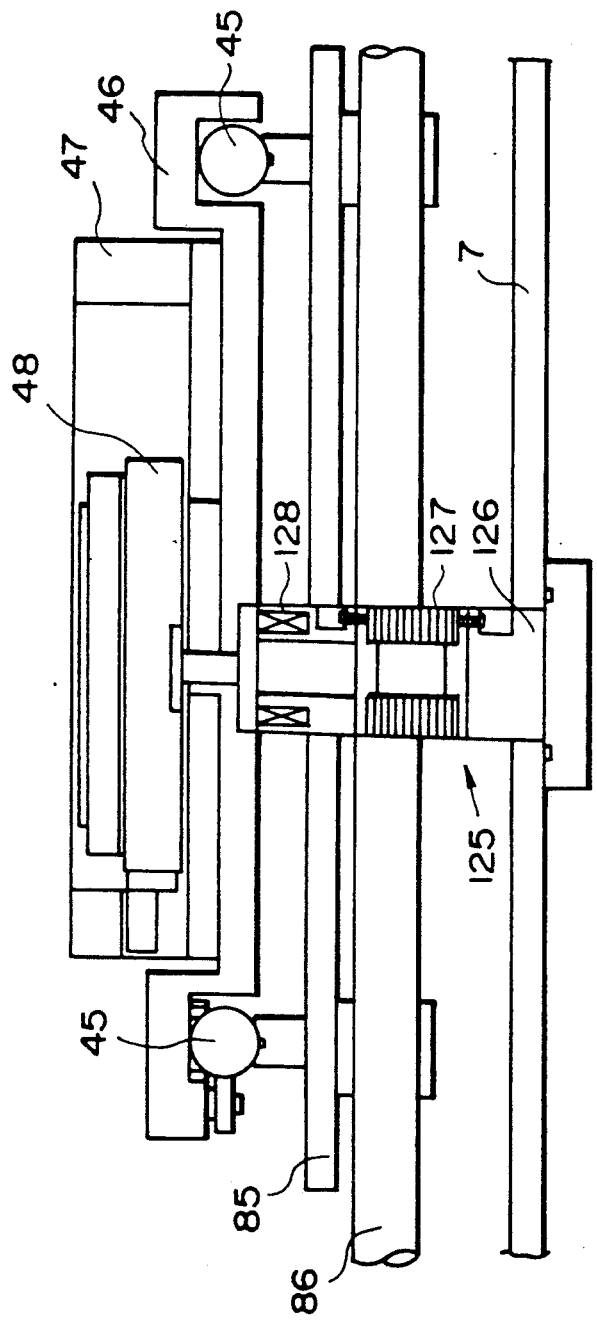

The changing of the irradiation area is also effected at the wafer unloading station E. As shown in FIG. 4, an irradiation area changing lift 125 has the similar functions to those of the lift described hereinbefore. As shown in FIG. 22A, there is provided a shaft 126 extending from the lower surface of the chamber 7. On the shaft 126, stacked piezoelectric elements 127 are mounted, on which a solenoid 128 is mounted. When the piezoelectric element 127 expand, the solenoid 128 raises the attracting plate 124. After this is accomplished, as shown in FIG. 22B, the irradiation table 46, the wafer holder 47 and the movable carriage 85 are moved along the longitudinal rail 86. As a result, the position of the irradiation area changing table 48 can be displaced with respect to the wafer holder 47. Then, the solenoid 128 and the piezoelectric elements 127 are de-energized, and the irradiation area changing table 48 and the wafer holder 47 are again coupled.

In the embodiments described in the foregoing paragraphs, the irradiation chambers 5a and 5b, located along the passage of circulation, have respective X-ray tubes. However, it is a possible alternative that one X-ray tube emits the X-rays in plural directions.

Figure 23A:
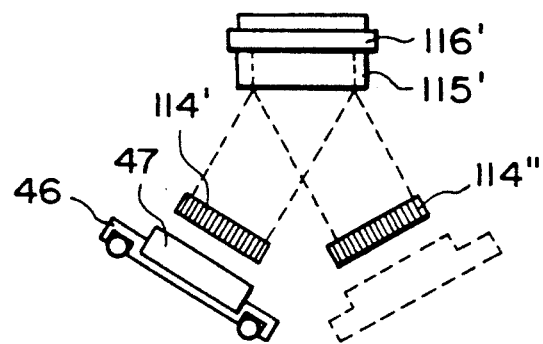
FIGS. 23A and 23B illustrate a structure by which a plurality of the masks are irradiated by a single X-ray source, according to an embodiment of the present invention.
Figure 23B:
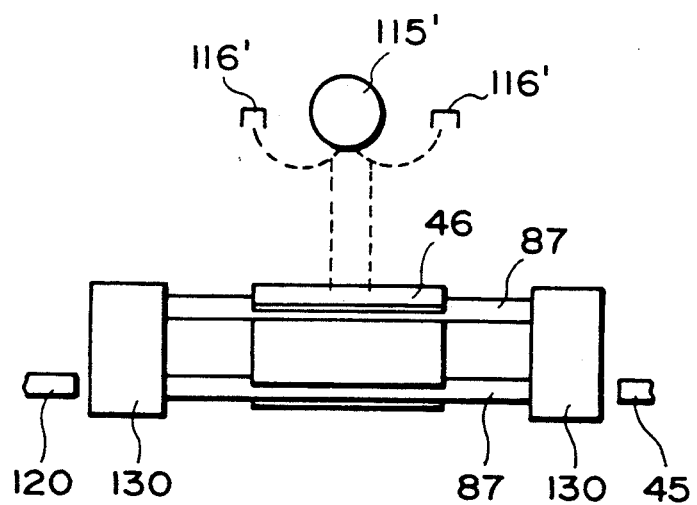
Figure 24:
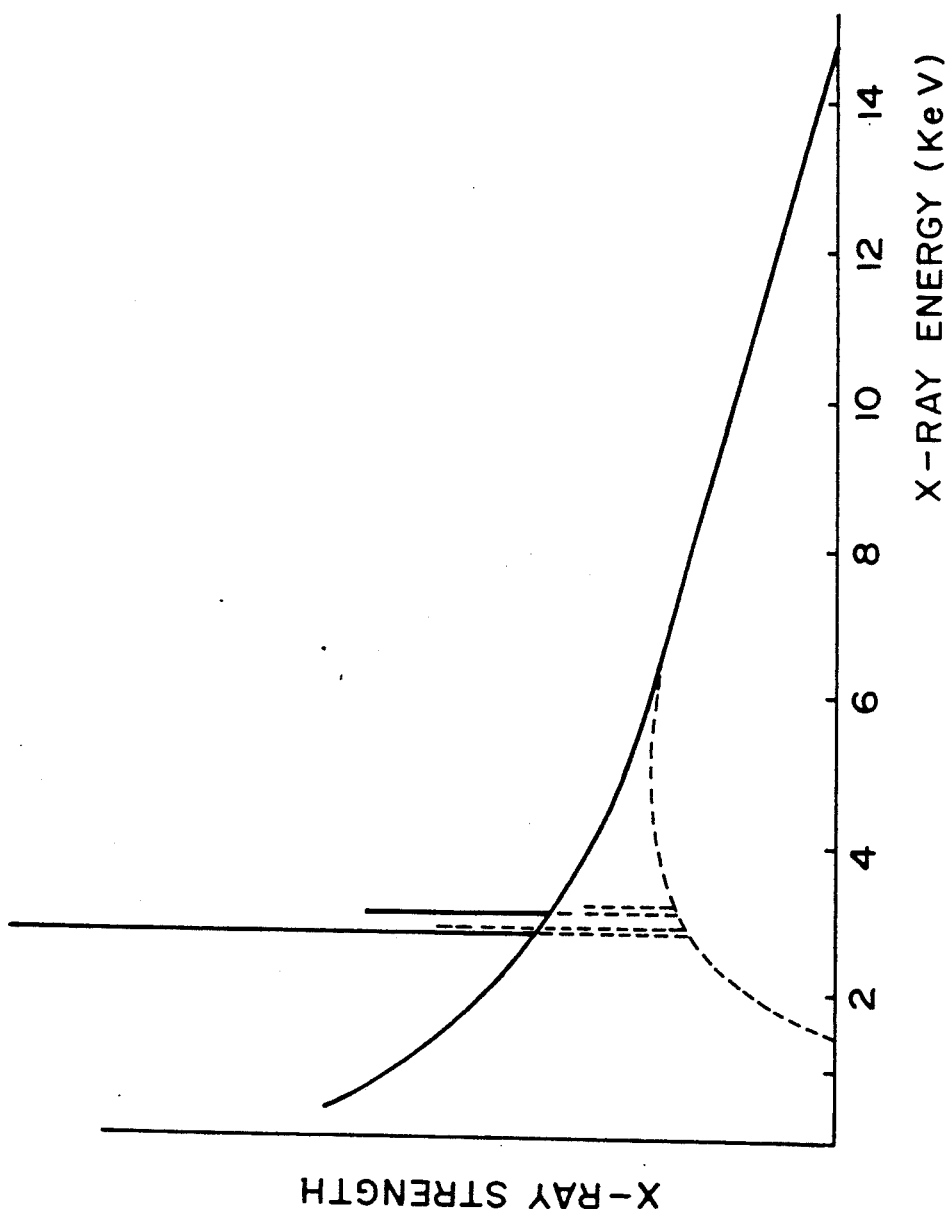
FIG. 24 is a graph showing the relation between the energy and the strength of the X-rays.

FIGS. 23A and 23B show this type of embodiment, wherein the reference numeral 115' is a target; and 116', 116' are electron guns. The electron beams emitted from the electron guns 116' and 116' impinge on the target 115' to generate soft X-rays. The soft X-rays pass through soller slits 114' and 114" which are provided within an X-ray diverging angle. The soller slit have the same functions as described before. However, the axes of the soller slits 114' and 114" are inclined, the irradiation table 46 is exposed to the X-rays while they are inclined internally, that is, toward each other. In this embodiment, an inclination table 130 which can provide an inclination about the inside one of the relay rails 87 and 87, which effects the inclination operation when the irradiation table 46 reaches from the lateral rail 45 to the relay rails 87. After the irradiation operation, the inclination table restores to allow the irradiation table 46 to move to the next lateral rails 120. The passage under the rest of the solar slit, 114", has a similar structure. An irradiation chamber containing those structures is connected between the main chamber 1 and the sub-chamber 6, thus constituting an X-ray exposure apparatus.

In the embodiment shown in FIG. 1, two irradiation chambers are disposed between the main chamber 1 and the sub-chamber 6. However, this may be doubled in parallel. This makes it possible to increase the scanning speed. Further, when one of the X-ray tube is disabled, the exposure step can be continued using the remaining.

The wafer loading cassette accommodating chamber 2 is such that it does not reduce the high vacuum in the main chamber 1, and in addition, the wafers are kept therein for a sufficient period time to emit the gases contained in the surface of the wafer. However, if the wafers are supplied from a resist applying station through a large pipe which is evacuated, the chamber 2 may be omitted, or may be used only for adjusting the difference in the vacuum between the pipe and the main chamber.

As described hereinbefore, the chamber 2 may be provided therein with a heater 141, which is effective to heat the inside of the chamber 2 to emit the gases more efficiently.

As described in the foregoing, according to the present invention, there is no such a member as a window shield, which introduces the energy from the energy generating source to the mask, the mask is irradiated more efficiently, so that the power supply to the energy generating source can be reduced, or that the irradiation period of time can be reduced, thus providing a high throughput.

In addition, the mask is irradiated by collimated X-rays so that, when the mask and the wafer are kept parallel while being exposed to the X-rays, the setting of them parallel may be much less strict, or that the necessity of alignment is eliminated between the center of the mask and the axis of the X-ray generating source.

When the mask and the wafer are supported integral with each other and exposed to the irradiation, plural masks may be continuously supplied. Particularly, when plural irradiation systems are provided in parallel, and they are scanned therein, the scanning speed may be increased, so that the throughput can be increased. Moreover, even when one of the irradiation systems is disabled for one reason or another, the required irradiation amount can be given if the scanning speed is lowered. This is advantageous in that the entire X-ray exposure apparatus is not needed to stop.

Additionally, since one wafer has divided or separate plural irradiation areas, the deformation of the wafer does not have a significant influence. And, the size of the mask may be small with the advantage of a small energy generating source.

In the embodiment disclosed herein, the mask and the wafer are once kept in the vacuum in the cassette accommodating chambers before they are fed into the main chamber, the gases contained in the mask and the wafer are emitted in the accommodating chambers, so that the vacuum in the main chamber is not disturbed. Furthermore, between the mask and the target of the irradiation system, there is a partition having the solar slit, which has such fine openings that the gases produced in the neighborhood of the target do not adversely affect the mask side.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, using x-rays, comprising:
a first holder for holding a first member having a pattern to be transferred;
a second holder for holding a second member having plural regions;
a supporting table for supporting said first holder holding the first member and said second holder holding the second member;
aligning means for imparting relative movement between said second holder holding the second member and said supporting table to align a region of the second member to the pattern of the first member held by said first holding means;
scanning means for substantially linearly moving said supporting table to expose the region, aligned by said aligning step, of the second member held by said second holder with the x-rays emitted through the first member held by said first holder; and
means for repeating said aligning and scanning steps for subsequent ones of the regions.

2. An apparatus according to claim 1 further comprising first accommodating means for accommodating said aligning means in a first ambience and second accommodating means for accommodating the first and second members in a second ambience when they are moved by the scanning means.

3. An apparatus according to claim 2, wherein the ambiences of said first and second accommodating means are controlled independently from each other.

4. An apparatus according to claim 2, further comprising means for isolating said first accommodating means and said second accommodating means from each other.

5. An apparatus according to claim 4, further comprising means for supporting a plurality of the second members, third accommodating means for accommodating said supporting means in a third ambience and means for isolating said first accommodating and said third accommodating means from each other.

6. An apparatus according to claim 1, wherein said aligning means includes means for aligning in a predetermined relation the first member and the respective area of the second member which is at said region.

7. An x-ray exposure method for sequentially transferring a pattern formed on a mask onto first and second areas of a wafer to form semi-conductor devices, comprising the steps of:
holding a mask on a mask holder;
holding a wafer on a wafer holder;
aligning the first area of the wafer with the pattern of the mask by moving the wafer holder relative to the mask holder;
coupling the mask holder and the wafer holder to prevent relative movement therebetween and maintain alignment between the pattern of the mask and the first area;
imparting relative movement between x-rays and the coupled mask holder and wafer holder to scan the first area of the wafer with the x-rays through the mask;
aligning the second area of the wafer with the pattern of the mask by moving the wafer holder relative to the mask holder;
coupling the mask holder and the wafer holder to prevent relative movement therebetween and maintain alignment between the pattern of the mask and the second area; and
imparting relative movement between x-rays and the coupled mask holder and wafer holder to scan the second area of the wafer with the x-rays through the mask.

8. An x-ray exposure method for sequentially transferring a pattern formed on a mask onto first and second areas of a wafer to form semi-conductor devices, comprising the steps of:
holding a mask on a mask holder;
holding a wafer on a wafer holder;
aligning the first area of the wafer with the pattern of the mask by relative movement between the wafer holder and the mask holder;
coupling the mask holder and the wafer holder to prevent relative movement therebetween and maintain alignment between the pattern of the mask and the first area;
imparting relative movement between x-rays and the coupled mask holder and wafer holder to scan the first area of the wafer with the x-rays through the mask from one end of the first area to the opposite end thereof;
aligning the second area of the wafer with the pattern of the mask by relative movement between the wafer holder and mask holder;
coupling the mask holder and the wafer holder to prevent relative movement therebetween and maintain alignment between the pattern of the mask and the second area; and imparting relative movement between x-rays and a coupled mask holder and wafer holder to scan the second area of the wafer with the x-rays through the mask from one end of the second area to the opposite end thereof.

9. A method according to claim 8, wherein the coupled mask holder and wafer holder is linearly moved relative to the x-rays during each of the relative movement imparting steps.

10. An x-ray exposure method for sequentially transferring a pattern formed on a mask onto first and second areas of a wafer to form semi-conductor devices, comprising the steps of:

holding a mask on a mask holder;
holding a wafer on a wafer holder;
detecting a first positional deviation between the pattern of the mask and the first area;
aligning the first area of the wafer with the pattern of the mask by relative movement between the wafer holder and the mask holder on the basis of the detected output of the first positional deviation;
coupling the mask holder and the wafer holder to prevent relative movement therebetween and maintain alignment between the pattern of the mask and the first area;
imparting relative movement between x-rays and the coupled mask holder and wafer holder to scan the first area of the wafer with the x-rays through the mask from one end of the first area to the opposite end thereof;
aligning the second area of the wafer with the pattern of the mask by relative movement between the wafer holder and mask holder on the basis of the detected output of the second positional deviation;
coupling the mask holder and the wafer holder to prevent relative movement therebetween and maintain alignment between the pattern of the mask and the second area; and
imparting relative movement between x-rays and a coupled mask holder and the wafer holder after the alignment between the mask pattern and the second area, to scan the second area of the wafer with the x-rays through the mask from one end of the second area to the opposite end thereof.

11. A semiconductor manufacturing exposure apparatus using x-rays, comprising:

a reduced-pressure chamber;
a mask cassette chamber for accommodating a mask cassette for containing a plurality of masks;
a wafer cassette chamber for accommodating a wafer cassette for containing a plurality of wafers;
a first shut-off valve for shutting a mask outlet port connecting an inside of said chamber and an inside of said mask cassette chamber;
a second shut-off valve for shutting a wafer outlet port connecting an inside of said chamber and an inside of said wafer cassette chamber;
a wafer holder for holding the wafer in said wafer cassette chamber; and
means for sequentially exposing a plurality of areas on the wafer held by said wafer holder with x-rays projected through the mask.

12. A semiconductor manufacturing exposure apparatus using x-rays, comprising:

a first wafer hand for removing a wafer from a wafer cassette;
a detector for detecting a cut-away portion formed in the wafer;
a wafer holder for holding the wafer;
a second wafer hand for transferring a wafer detected to have a cut-away portion toward said wafer holder;
moving means for moving said wafer holder for sequentially positioning a plurality of areas on the wafer to face a mask; and
means for scanningly exposing the plurality of areas facing the mask with x-rays projected through the mask.

13. A semiconductor device manufacturing method, comprising the steps of:

removing a wafer from a wafer cassette, with the wafer including first and second areas;
detecting a cut-away portion formed in the wafer removed from the wafer cassette;
holding the wafer with a wafer holder;
moving the wafer holder to position the first area facing a mask;
detecting a first alignment mark on the wafer and adjusting a relative positional relation between the mask and the first area;
scanning the first area with radiation rays projected through the mask to expose the first area, with the radiation rays including x-rays;
moving the wafer holder to position the second area facing the mask;
detecting a second alignment mark on the wafer and adjusting a relative positional relation between the mask and the second area; and
scanning the second area with the radiation rays projected through the mask.

14. A method according to claim 13, further comprising the step of adjusting inclination of the wafer holder relative to a predetermined reference surface so that at least a part of a surface of the wafer is parallel with the reference surface.

15. A semiconductor device manufacturing method, comprising the steps of:

removing a wafer from a wafer cassette, with the wafer including first and second areas;
detecting a cut-away portion formed in the wafer removed from the wafer cassette;
holding the wafer with a wafer holder;
scanning the first area of the wafer held by the wafer holder with radiation rays projected through a mask to expose the first area with the radiation rays including x-rays; and
scanning the second area of the wafer held by the wafer holder with radiation rays projected through the mask to expose the second area with the radiation including x-rays.

16. A method according to claim 15, wherein the wafer is removed from the wafer cassette by a first hand, and further comprising the step of transferring the wafer to the wafer holder by a second hand after said detecting step.

17. An exposure apparatus usable for manufacturing a semiconductor device, comprising:

a reduced-pressure chamber;
a detector for detecting a cut-away portion of a wafer housed in the reduced-pressure chamber;
a wafer holder for holding the wafer in said reduced-pressure chamber;

a conveying mechanism for conveying a wafer in which a cut-away portion is detected to said wafer holder; and exposing means for sequentially exposing a plurality of areas of the wafer held by said wafer holder with radiation rays including x-rays.

18. An apparatus according to claim 17, wherein said exposing means includes a stage for moving said wafer holder relative to a mask.

19. A semiconductor device manufacturing method, comprising the steps of:

holding a wafer including first and second areas with a wafer holder;

moving the wafer holder to position the first area facing a mask;

imparting a relative movement between the mask and the wafer to adjust the relative position between the mask and the first area;

exposing the first area with radiation rays generated by a first radiation source and which include x-rays;

imparting a relative movement between the mask and the wafer to adjust the relative position between the mask and the second area; and exposing the second area with radiation rays generated by a second radiation source different from said first radiation source and which include x-rays.

* * * * *

UNITED STATES PATENT AND TRADEMARK OFFICE
CERTIFICATE OF CORRECTION

PATENT NO. : 5,164,974
DATED : November 17, 1992
INVENTOR(S) : Takao Kariya

It is certified that error appears in the above-identified patent and that said Letters Patent is hereby corrected as shown below:

COLUMN 2:

Line 7, "in" should read --on--.

COLUMN 8:

Line 63, "setting," should read --setting--.

COLUMN 10:

Line 39, "from" should read --from among--.

COLUMN 11:

Line 15, "members 81 and 82." should read --members 81 and 81.--.

COLUMN 15:

Line 59, "beared" should read --borne--.

COLUMN 16:

Line 27, "soft paral-" should read --parallel soft--.

UNITED STATES PATENT AND TRADEMARK OFFICE
CERTIFICATE OF CORRECTION

PATENT NO. : 5,164,974
DATED : November 17, 1992
INVENTOR(S) : Takao Kariya

It is certified that error appears in the above-identified patent and that said Letters Patent is hereby corrected as shown below:

Line 28, "lel," should be deleted.
    Line 30, "of" should be deleted.

COLUMN 17:

Line 51, "beared" should read --borne--.

COLUMN 21:

Line 4, "and" should read --and the--.
    Line 32, "thereof;" should read --thereof;
        ¶ detecting a second positional deviation between
        the pattern of the mask and the second area;--.

Signed and Sealed this

Eighth Day of February, 1994

Attest:

BRUCE LEHMAN

Attesting Officer    Commissioner of Patents and Trademarks